United States Patent [19]

Miyakawa et al.

[11] Patent Number: 5,095,461
[45] Date of Patent: Mar. 10, 1992

[54] ERASE CIRCUITRY FOR A NON-VOLATILE SEMICONDUCTOR MEMORY DEVICE

[75] Inventors: Tadashi Miyakawa; Masamichi Asano, both of Tokyo, Japan

[73] Assignee: Kabushiki Kaisha Toshiba, Kawasaki, Japan

[21] Appl. No.: 457,859

[22] Filed: Dec. 27, 1989

[30] Foreign Application Priority Data

Dec. 28, 1988 [JP] Japan ................................ 63-333578

[51] Int. Cl.[5] ...................... G11C 7/00; G11C 16/00; G11C 16/06
[52] U.S. Cl. .................................. 365/185; 365/218; 365/189.09; 365/203
[58] Field of Search ............ 365/218, 51, 185, 230.03, 365/189.09, 189.08, 203 X; 357/23.5, 54; 307/296.1, 296.5, 296.8, 304

[56] References Cited

U.S. PATENT DOCUMENTS

| | | | |
|---|---|---|---|
| 4,437,174 | 3/1984 | Masvoka | 365/218 |
| 4,466,081 | 8/1984 | Masuoka | 365/218 |
| 4,511,996 | 4/1985 | Jacobs | 365/218 X |
| 4,797,856 | 4/1987 | Lee et al. | 365/185 |
| 4,827,450 | 5/1989 | Kowalski | 365/185 |
| 4,878,101 | 10/1989 | Hsieh et al. | 365/185 X |
| 4,888,738 | 12/1989 | Wong et al. | 365/218 |

Primary Examiner—Alyssa H. Bowler
Attorney, Agent, or Firm—Banner, Birch, McKie & Beckett

[57] ABSTRACT

An memory cell array includes a plurality of electrically erasable and programmable memory cell transistors which are arranged in a matrix form and each of which includes a source region, drain region, floating gate, erasing gate and control gate. The patterns of the control gates and the source regions in the memory cell array are arranged in parallel along the row direction of the memory cell array and the patterns of the erasing gates are arranged to extend in the column direction of the memory cell array. The memory cell transistors in the memory cell array are selected by a row decoder and a column decoder. An erasing circuit functions to erase memory data of each memory cell transistor by applying an erasing potential to the erasing gate of the memory cell transistor. A source potential generation circuit applies a first potential for programming and readout to the source region of a memory cell transistor selected by the row and column decoders when data is programmed into or read out from the selected memory cell transistor and applies a second potential which is higher than the first potential and lower than the erasing potential to the source region of each memory cell transistor when memory data of each memory cell transistor is erased by the erasing circuit. A potential difference between the source region and the erasing gate of the memory cell transistor in the erasing mode is reduced by the second potential output from the source potential generation circuit.

42 Claims, 18 Drawing Sheets

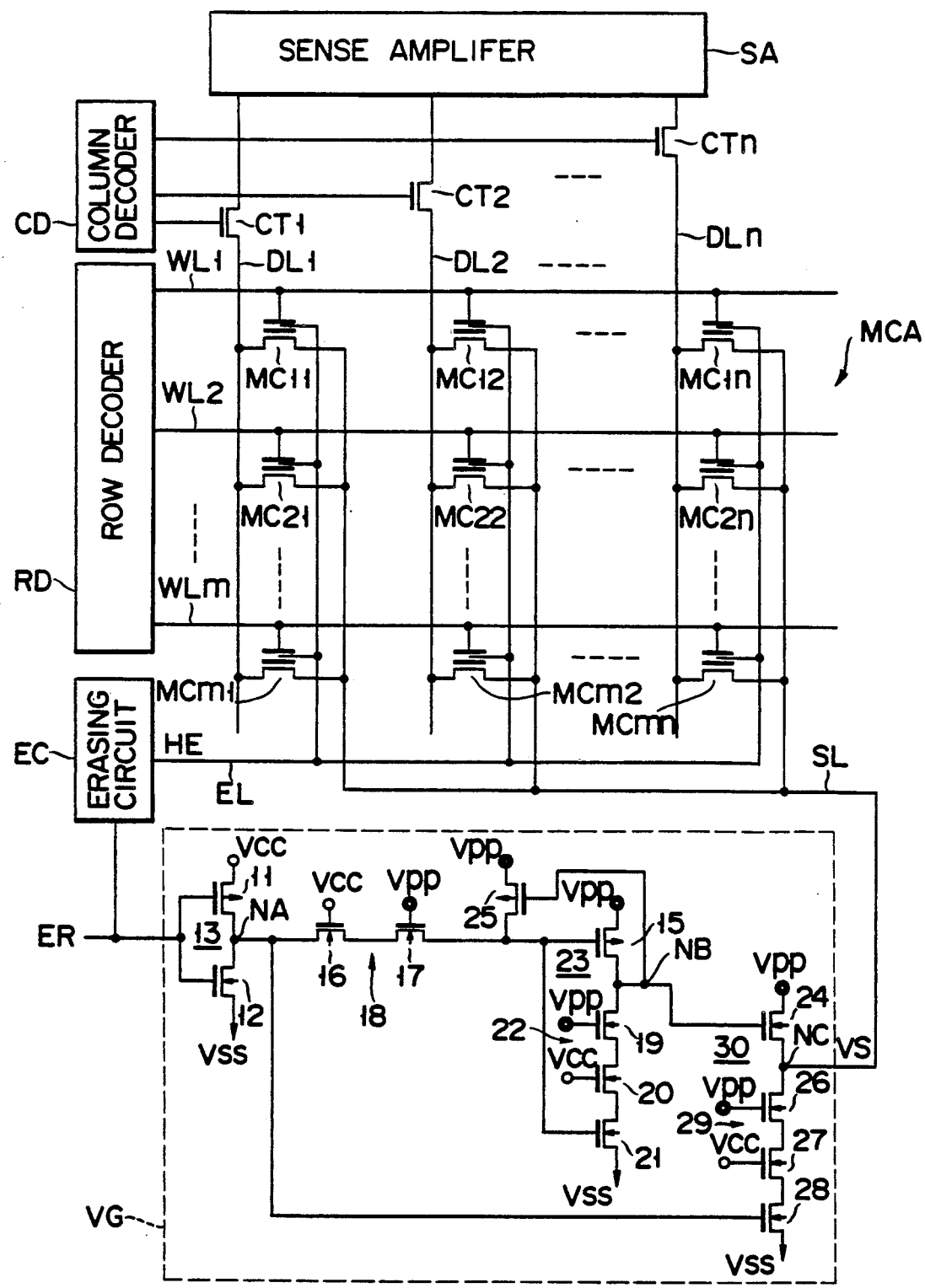
F I G. 1

| MODE | Vpp(V) | VS(V) | NA(V) | NB(V) | WL(V) | DL(V) | HE(V) | ER(V) |
|---|---|---|---|---|---|---|---|---|
| READOUT | 5 | 0 | 5 | 0 | 5 | 2 | 0 | 0 |
| PROGRAM-MING | 12 | 0 | 5 | 0 | 12 | 8 | 5 | 0 |
| ERASING | 12 | 10 | 0 | 12 | 0 | 0 | 20 | 5 |

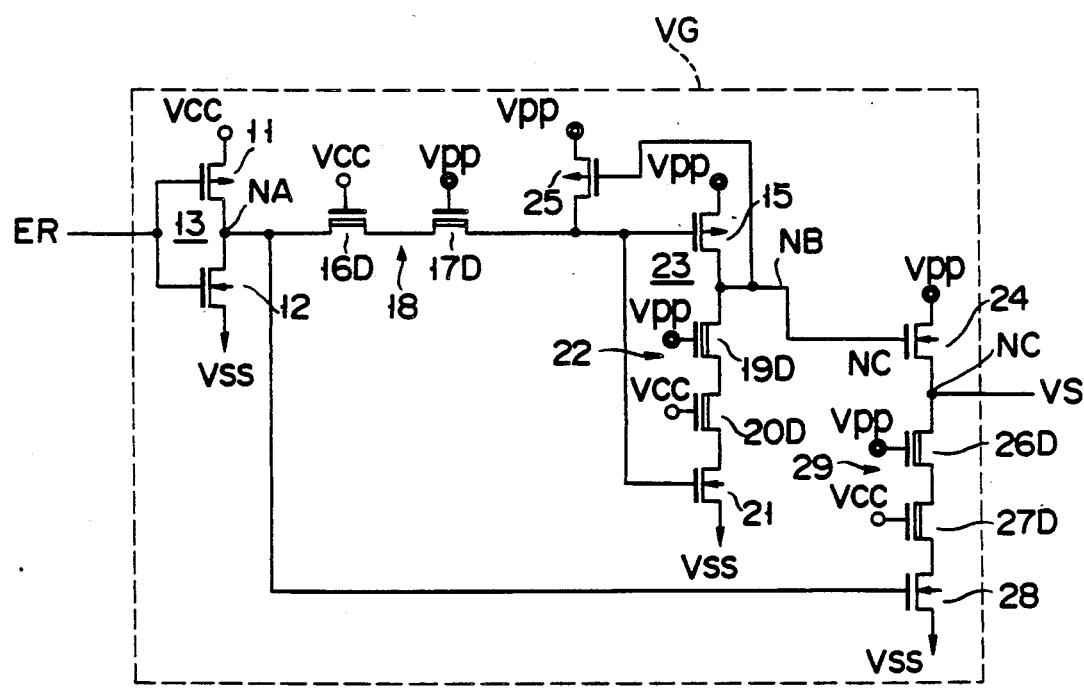
F I G. 4

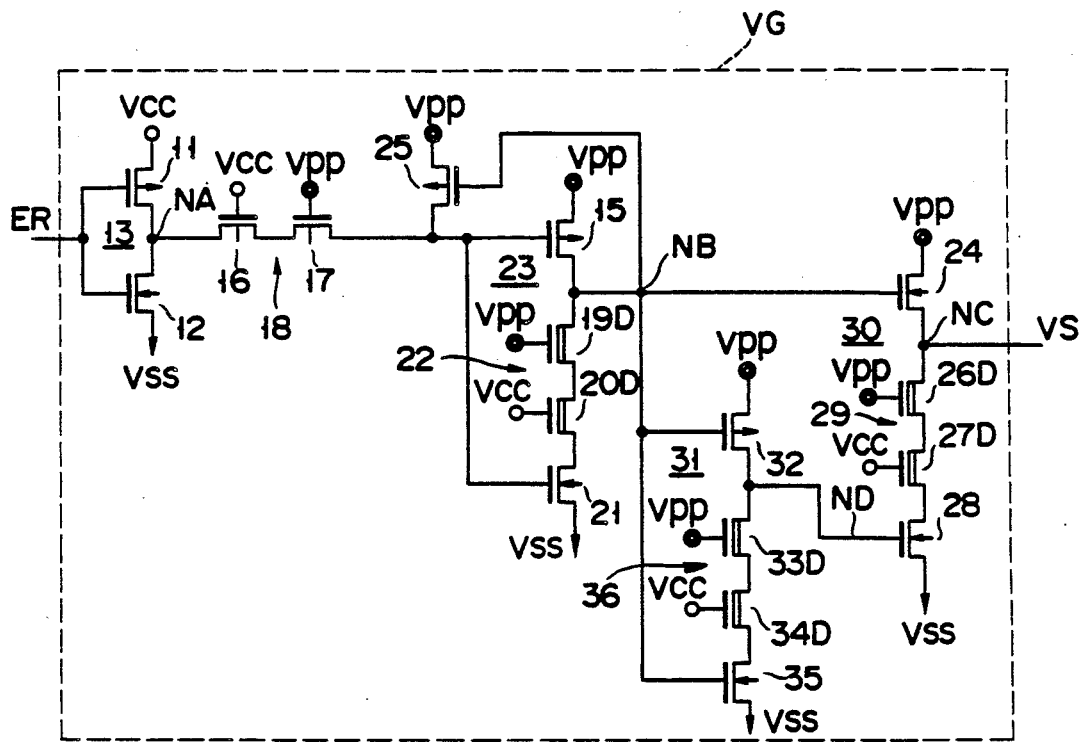
F I G. 5
| MODE | Vpp(V) | VS(V) | ND(V) | NB(V) | WL(V) | DL(V) | HE(V) | ER(V) |
|---|---|---|---|---|---|---|---|---|
| READOUT | 5 | 0 | 5 | 0 | 5 | 2 | 0 | 0 |
| PROGRAM-MING | 12 | 0 | 12 | 0 | 12 | 8 | 5 | 0 |
| ERASING | 12 | 10 | 0 | 12 | 0 | 0 | 20 | 5 |
F I G. 6

| MODE | Vpp(V) | VS(V) | WL(V) | DL(V) | HE(V) | ER(V) |
|---|---|---|---|---|---|---|
| READOUT | 5 | 0 | 5 | 2 | 0 | 0 |
| PROGRAM-MING | 12 | 0 | 12 | 8 | 5 | 0 |
| ERASING | 12 | 12 | 0 | 0 | 20 | 5 |

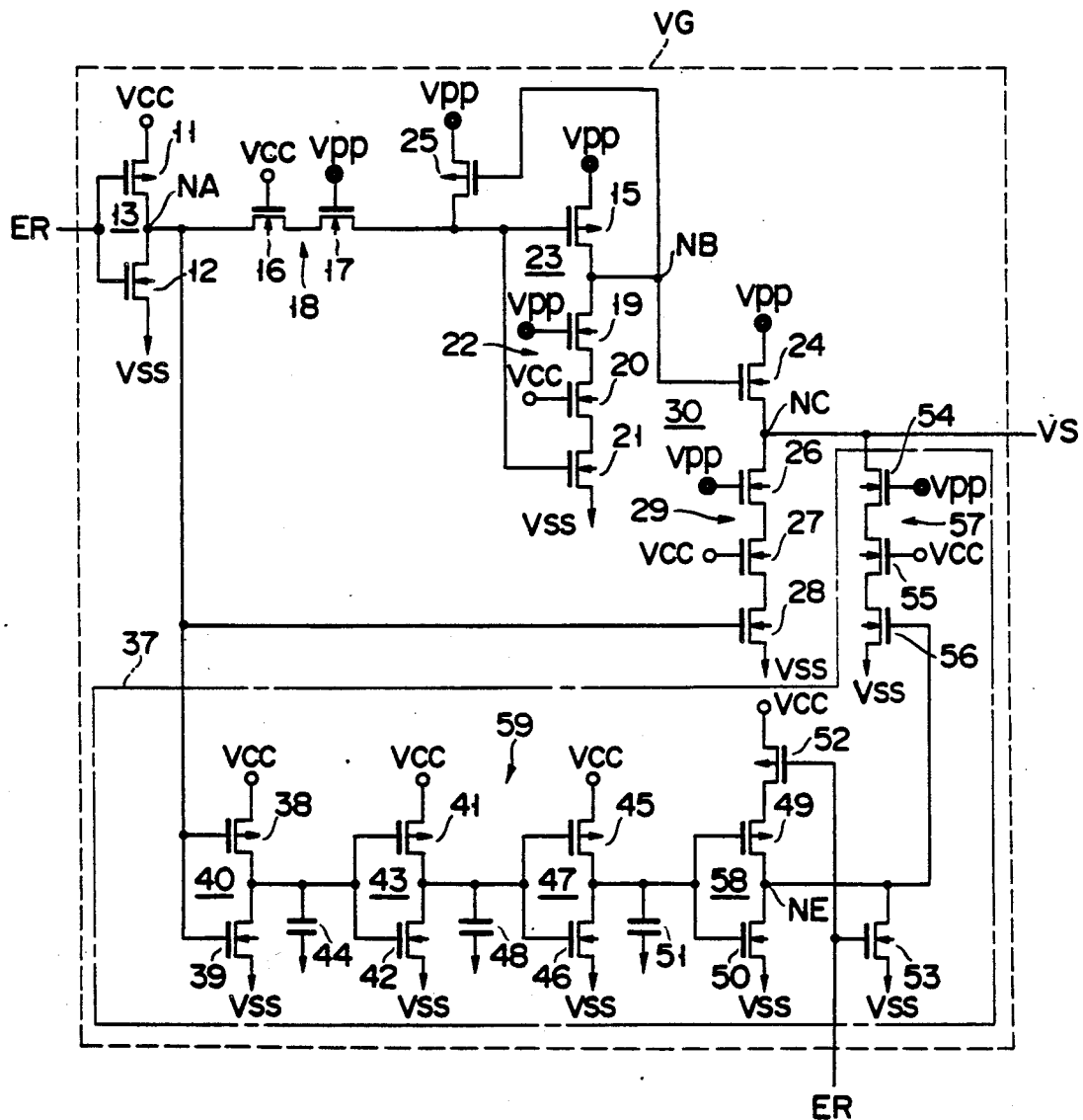
F I G. 9

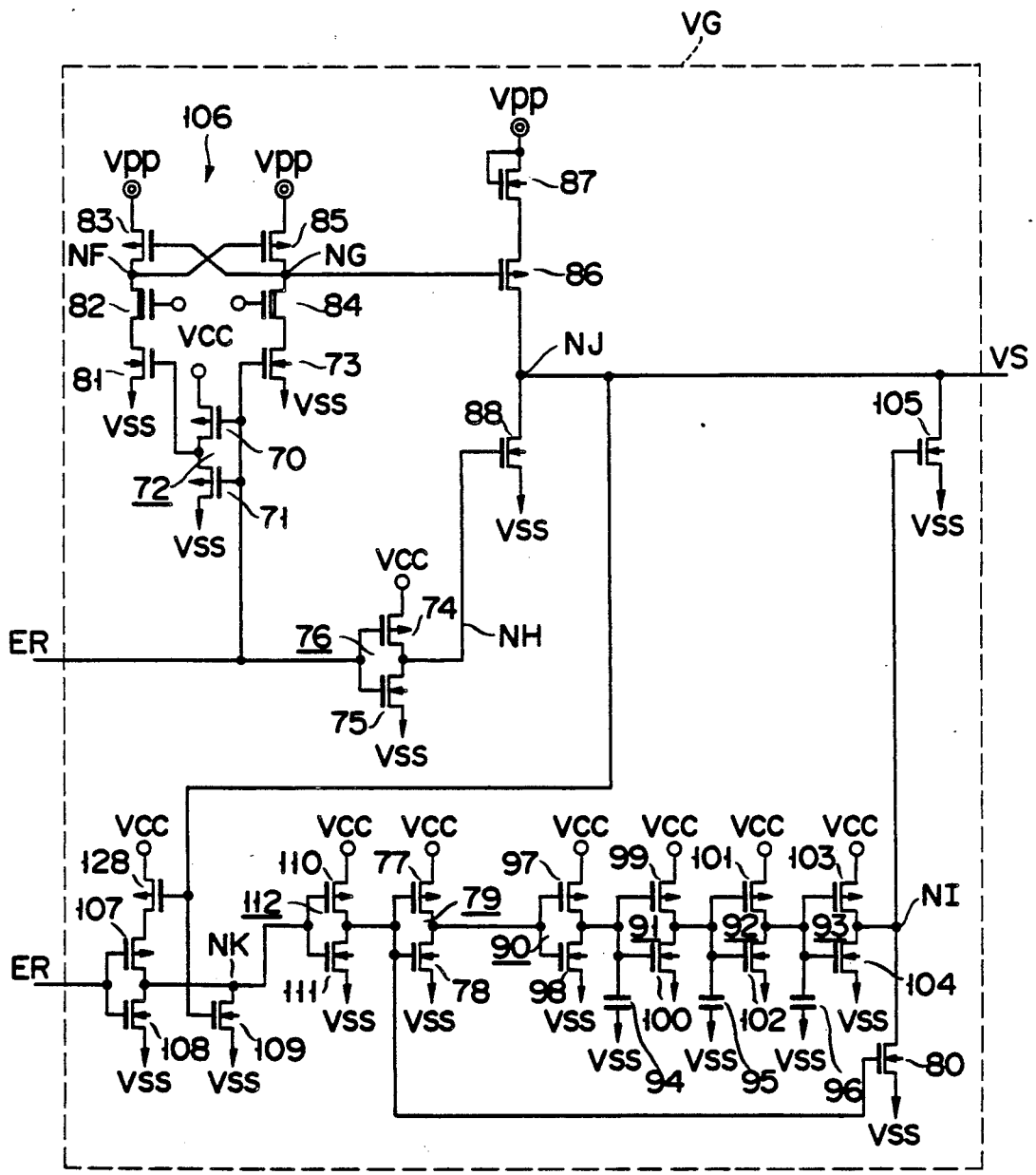
F I G. 12

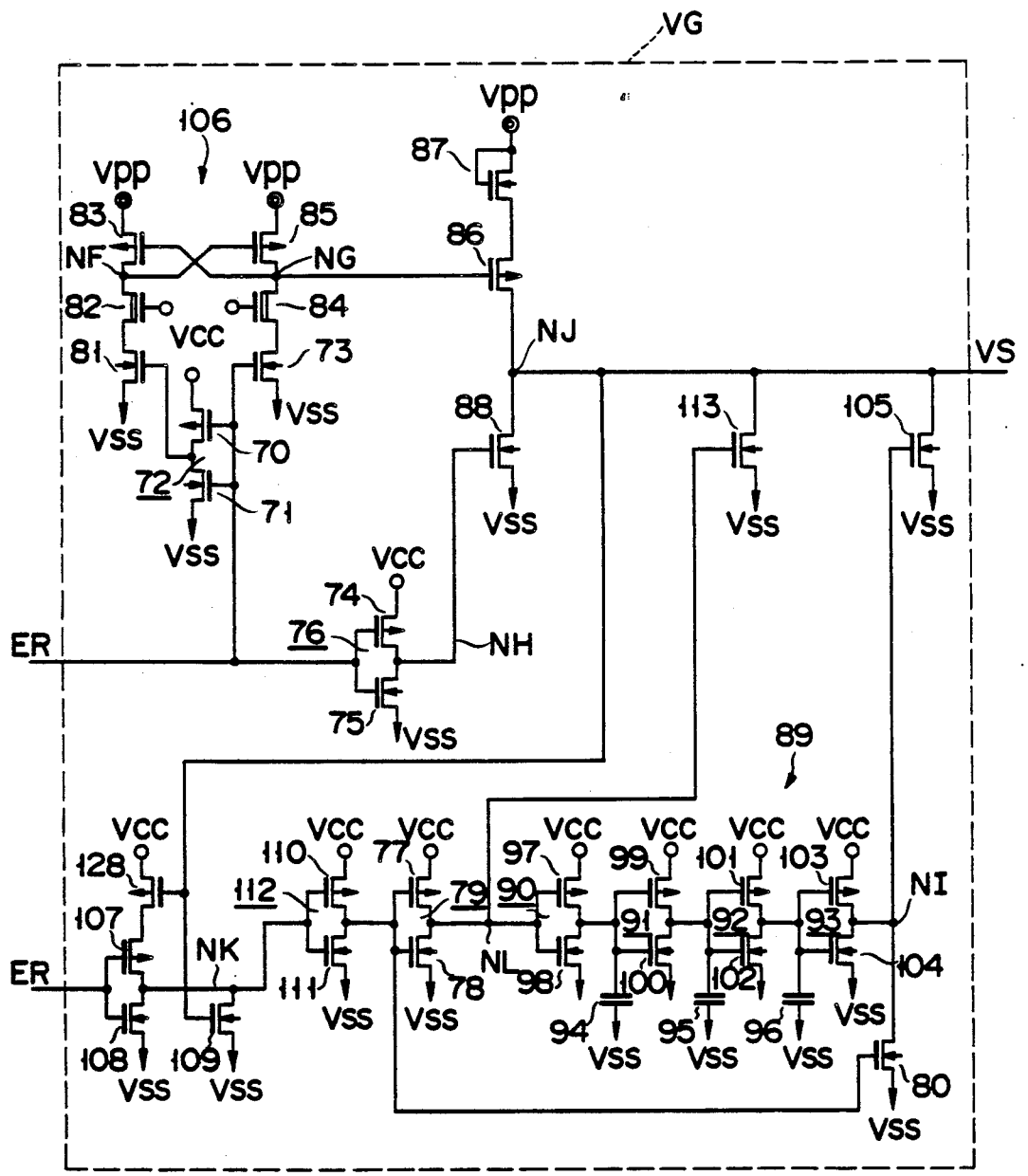
F I G. 13

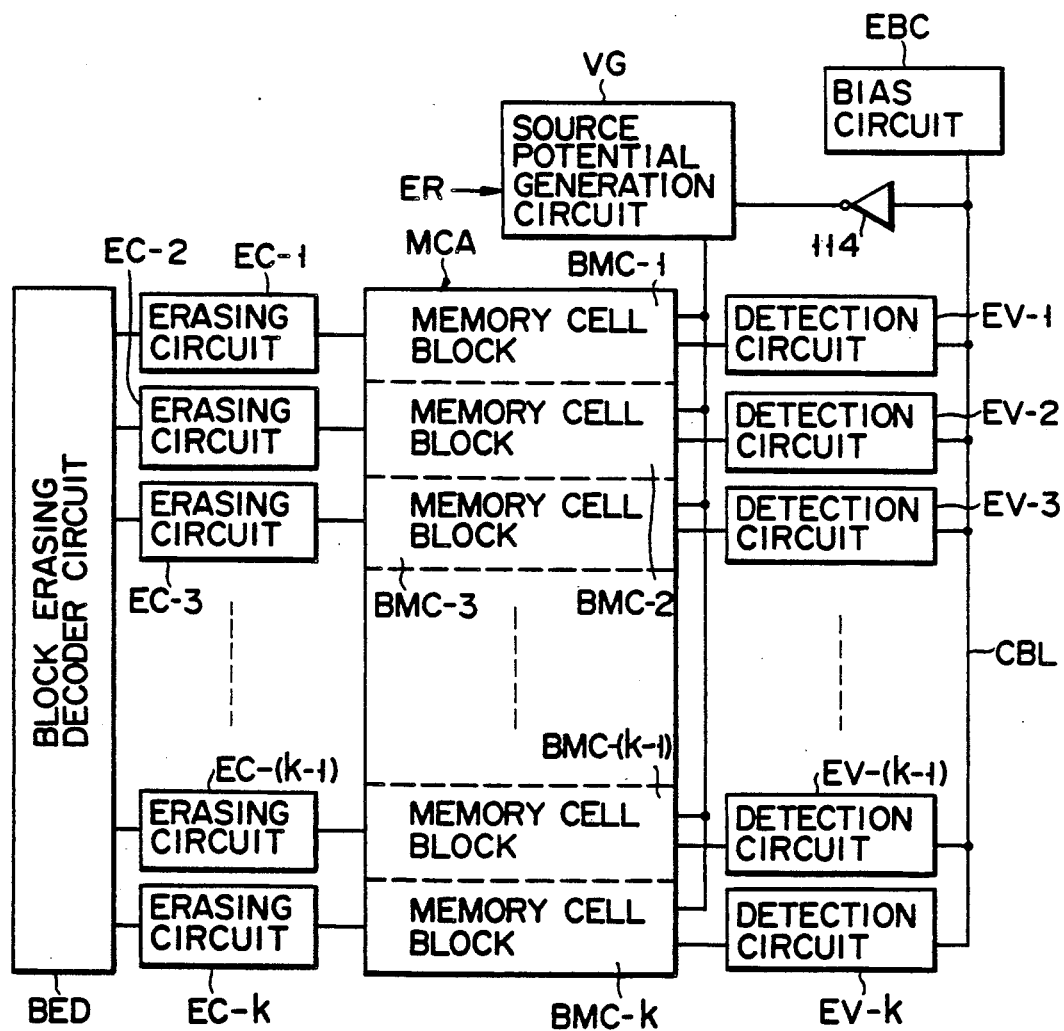
F I G. 18

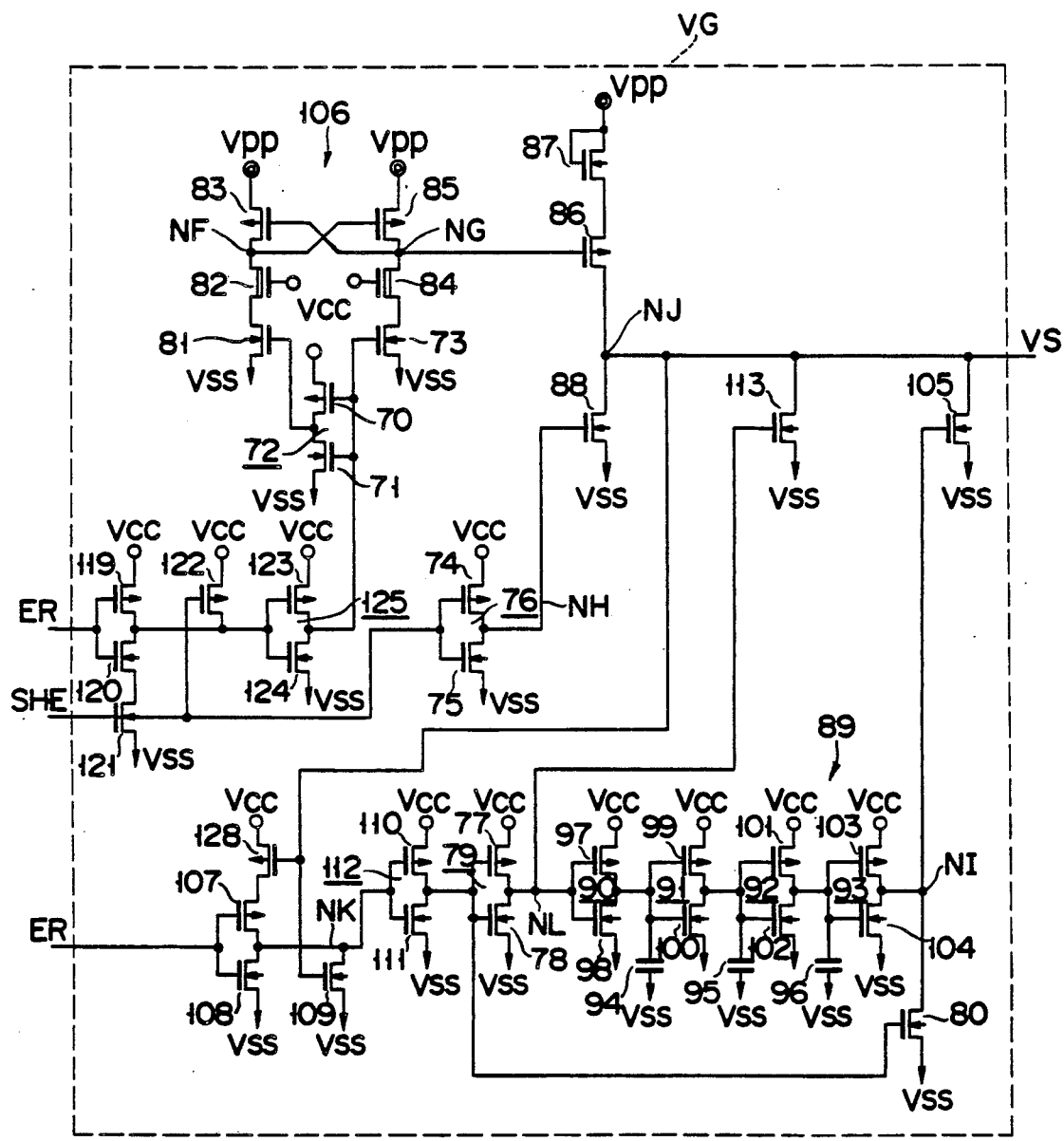
F I G. 20

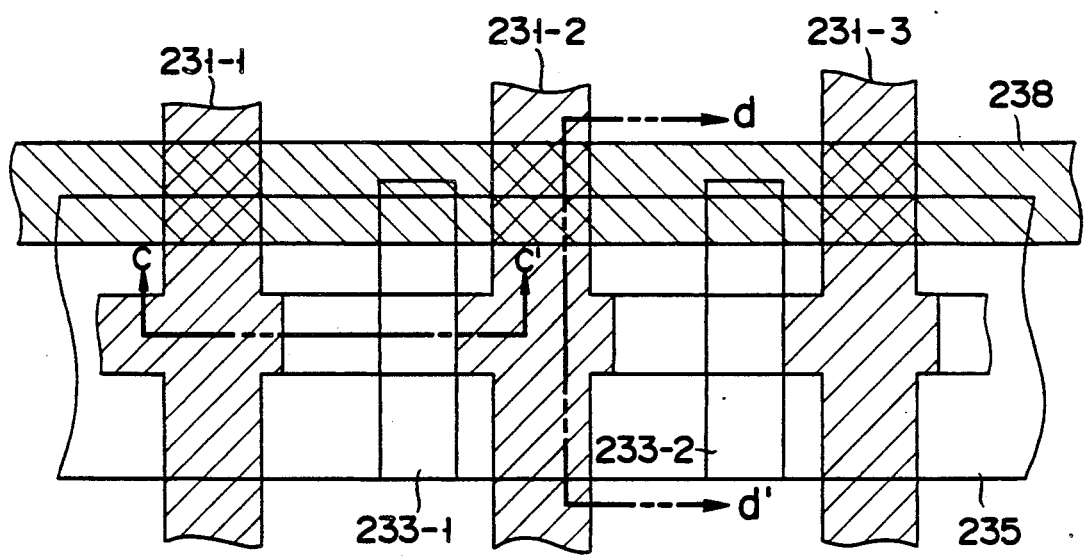
F I G. 23

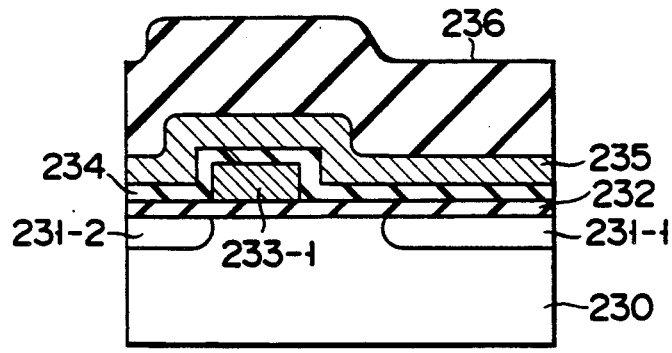
F I G. 24A
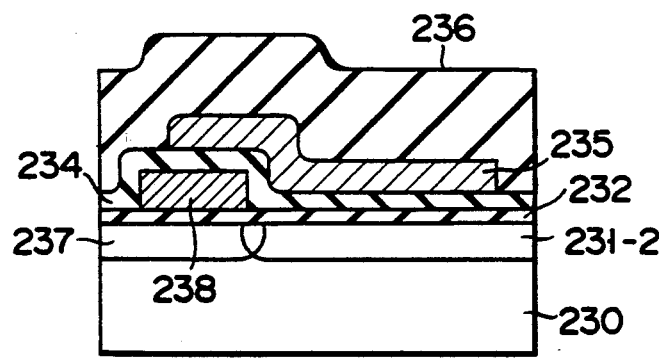
F I G. 24B

ERASE CIRCUITRY FOR A NON-VOLATILE SEMICONDUCTOR MEMORY DEVICE

BACKGROUND OF THE INVENTION

1. Field of the Invention

This invention relates to a nonvolatile semiconductor memory device, and more particularly to an EEPROM having control gate electrode and source region patterns formed in parallel with each other and erasing gate electrode patterns formed to intersect the control gate electrode and source region patterns.

2. Description of the Related Art

An EEPROM is widely known as an electrically erasable and programmable nonvolatile semiconductor memory device. The EEPROM is generally constructed by a memory cell transistor having a three-layered gate structure including a floating gate electrode formed of a first polysilicon layer, an erasing gate electrode formed of a second polysilicon layer and a control gate electrode formed of a third polysilicon layer. In this type of memory device, the control gate electrode and source region patterns are alternately arranged in parallel with each other and the erasing gate electrode patterns are formed to extend in the channel lengthwise direction of the memory cell transistor or in a direction intersecting the control gate electrode and source region patterns in order to reduce the size of the memory cell transistor. The construction of the above EEPROM is described in U.S. Pat. No. 4,466,081, for example.

In the above EEPROM, the control gate electrode and the source region inevitably intersect the erasing gate electrode. In this case, a problem occurs in that part of the source region which intersects the erasing gate electrode. When memory data in a memory cell is erased, a voltage applied to the erasing gate electrode is raised so as to drive out electrons stored in the floating gate electrode to the erasing gate electrode by making use of the tunnel effect of a thin oxide film disposed between the floating gate electrode and the erasing gate electrode. For this reason, in the erasing operation, a high voltage is applied to the erasing gate electrode. The source region which intersects the erasing gate electrode is always set at a ground potential, or it is always applied with 0 V, for example. Therefore, if a voltage of 20 V is applied to the erasing gate electrode, for example, a voltage of as high as 20 V is applied between the erasing gate electrode and the source region at the intersecting portion thereof. In this case, if the oxide film disposed between the erasing gate electrode and the source region is thin (for example, with a thickness of approximately 300 Å), an electric field of as strong as approximately 6.7 MV/cm is applied to the oxide film. As a result, the oxide film may be easily broken down, degrading the reliability of the memory device.

In order to solve the problem caused by the high potential difference occurring in the above intersecting portion in the erasing operation, the oxide film disposed between the erasing gate electrode and the source region at the intersection portion thereof is generally made thick. When the thickness of the oxide film disposed between the erasing gate electrode and the source region is set to approx. 2000 Å, the electric field applied to the oxide film is reduced to approx. 1 MV/cm, preventing the oxide film from dielectric breakdown.

However, problems occur when a thick oxide film is selectively formed in each intersecting portion. In order to form the thick oxide film only in the intersecting portion, a thick oxide film is formed on the entire surface of the structure and then that portion of the thick oxide film which does not lie in the intersecting portion is selectively removed. In a case where the thick oxide film is formed by the CVD method, for example, the oxide film is formed thick on the source region but is formed thin on the field oxide layer since the growth speed of the oxide film is different on the semiconductor substrate and on the field oxide layer. When the thick oxide film which is not uniform in thickness is selectively removed by an etching process so as to be left behind only in the intersecting portion, that portion of the field oxide layer which lies under the thin oxide film is partly etched and the thickness thereof is reduced. If, in this way, the thickness of the field oxide layer acting as an element isolation region is reduced, leak may occur between elements, degrading the reliability of the memory cell. Further, since the field oxide film is originally formed thin in the bird's beak portion thereof, the substrate surface is exposed in the etching process and a concave or hollow-out portion is formed. Formation of the hollow-out portion of the substrate causes the width of the floating gate electrode which is formed in the later process to be increased, making it difficult to obtain a transistor characteristic as designed.

SUMMARY OF THE INVENTION

An object of this invention is to provide a highly reliable nonvolatile semiconductor memory device.

Another object of this invention is to provide a nonvolatile semiconductor memory device in which dielectric breakdown of an intersecting portion between the erasing gate electrode and the source region can be enhanced without forming a thick oxide film in the intersecting portion.

A still another object of this invention is to provide a nonvolatile semiconductor memory device in which fluctuation in the characteristic of the memory cell transistor and leak between elements caused by etching the field oxide layer can be suppressed.

The above objects may be attained by a nonvolatile semiconductor memory device comprising a memory cell array having a plurality of electrically erasable and programmable memory cell transistors which each have a source region, drain region, floating gate, erasing gate and control gate; a selection circuit for selecting the memory cell transistors in the memory cell array; an erasing circuit for erasing memory data of the memory cell transistor by applying an erasing potential to the erasing gate of each of the memory cell transistors; and a source potential generation circuit for applying a first potential for programming and readout to the source region of the memory cell transistor selected by the selection circuit when data is programmed into or read out from the selected memory cell transistor and applying a second potential which is higher than the first potential and lower than the erasing potential to the source region of the memory cell transistor to erase memory data in the memory cell transistor.

In the above nonvolatile semiconductor memory device, a preset bias voltage is applied to the source region by means of the source potential generating circuit to reduce the potential difference between the erasing gate and the source region in the erasing mode. Therefore, the electric field applied to the oxide film in the intersecting portion between the erasing gate and the source region becomes weak, making it difficult to cause the dielectric breakdown of the oxide film and enhancing the reliability of the nonvolatile semiconductor memory device.

Further, since the electric field applied to the oxide film in the intersecting portion between the erasing gate and the source region becomes weak, the oxide film can be made thin. Therefore, it becomes possible to provide a nonvolatile semiconductor memory device in which the dielectric breakdown voltage of the intersecting portion between the erasing gate and the source region can be enhanced without forming a thick oxide film in the intersecting portion.

Since it is not necessary to form a thick oxide film in the intersecting portion between the erasing gate and the source region, it becomes possible to suppress occurrence of the problems of the leak between elements caused by reduction in the thickness of the field oxide layer when the thick oxide film is selectively etched and fluctuation in the characteristics of the memory cell transistor caused by the presence of the hollow-out portion in the surface area of the substrate formed by etching the bird's beak portion.

BRIEF DESCRIPTION OF THE DRAWINGS

FIG. 1 is a circuit diagram showing the schematic construction of a nonvolatile semiconductor memory device according to a first embodiment of this invention;

FIG. 4 is a circuit diagram showing a source potential generating circuit which is part of a nonvolatile semiconductor memory device according to a third embodiment of this invention and can be obtained by modifying the source potential generating circuit in the circuit shown in FIG. 1;

FIG. 5 is a circuit diagram showing a source potential generating circuit which is part of a nonvolatile semiconductor memory device according to a fourth embodiment of this invention and can be obtained by modifying the source potential generating circuit in the circuit shown in FIG. 1;

FIG. 6 is a diagram showing the relation between each operation mode and each signal and a potential at each node to illustrate the operation of the circuit shown in FIG. 5;

FIG. 9 is a circuit diagram showing a source potential generating circuit which is part of a non-volatile semiconductor memory device according to a sixth embodiment of this invention and can be obtained by modifying the source potential generating circuit in the circuit shown in FIG. 1;

FIGS. 11 to 13 show other constructions of the source potential generation circuits which are parts of nonvolatile semiconductor memory devices according to seventh to ninth embodiments of this invention and can be obtained by modifying the source potential generating circuit in the circuit shown in FIG. 1;

FIG. 18 is a block diagram showing a memory device which is part of a nonvolatile semiconductor memory device according to a thirteenth embodiment of this invention and in which memory data is erased for each block;

FIG. 20 shows the construction of a source potential generation circuit in the circuit of FIG. 18;

FIG. 23 is a plan view showing another pattern construction of part of the memory cell array in the circuit of FIG. 1;

FIG. 24A is a cross sectional view of the pattern taken along the line c—c' of FIG. 23; and FIG. 24B is a cross sectional view of the pattern taken along the line d—d' of FIG. 23.

DETAILED DESCRIPTION OF THE PREFERRED EMBODIMENTS

Figures 2, 3:
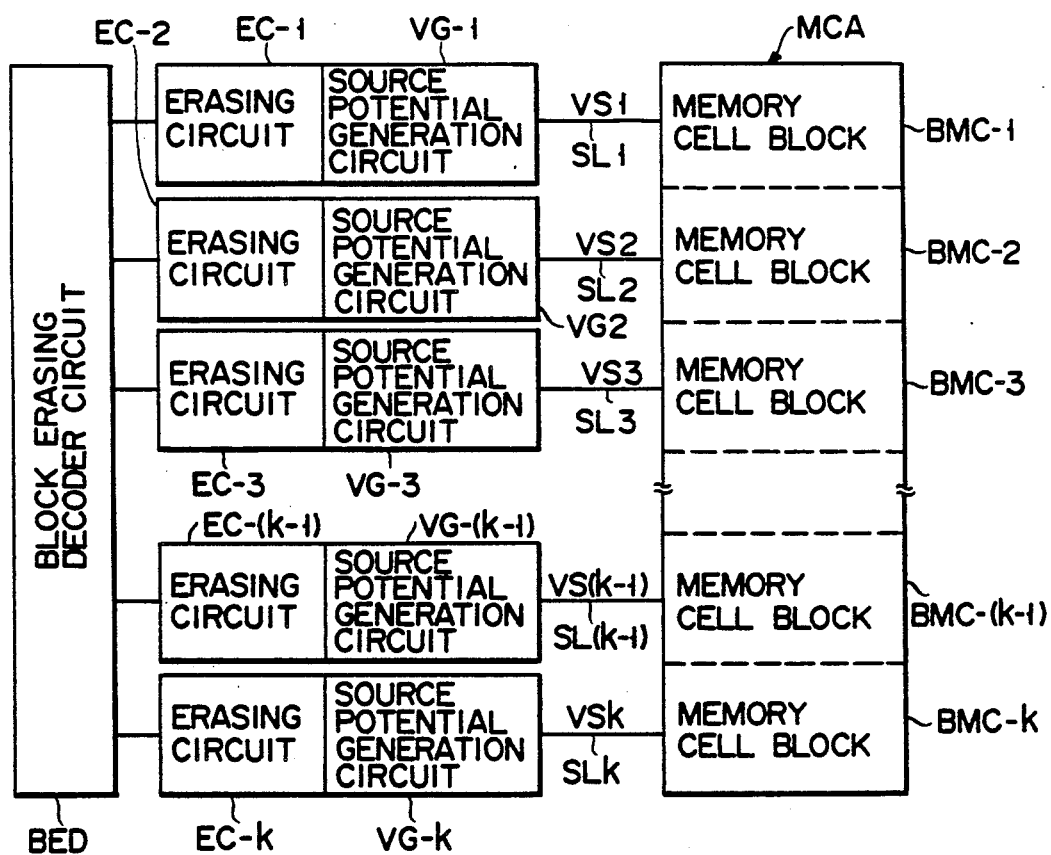
FIG. 2 is a diagram showing the relation between each operation mode of the circuit shown in FIG. 1 and each signal and a potential at each node.
FIG. 3 is a block diagram showing a memory device which is part of a nonvolatile semiconductor memory device according to a second embodiment of this invention and in which memory data is erased for each block.

FIG. 1 is a circuit diagram showing the schematic construction of a memory cell array and a peripheral circuit thereof in a nonvolatile semiconductor memory device according to a first embodiment of this invention.

A memory cell Array MCA is constructed by a plurality of memory cell transistors MC11 to MCmn arranged in a matrix form of m rows × n columns and each having a laminated gate structure of a floating gate, a control gate and an erasing gate. The control gates of the memory cell transistors MC11 to MCmn which lie on the same row are connected to a corresponding one of word lines WL1 to WLm. The word lines WL1 to WLm are selected by means of a row decoder RD. The drains of the memory cell transistors MC11 to MCmn which lie on the same column are connected to a corresponding one of data lines (bit lines) DL1 to DLn. The data lines DL1 to DLn are respectively connected to one end of the current paths of transfer gate transistors CT1 to CTn and the other ends of the current paths of the transfer gate transistors CT1 to CTn are connected to a sense amplifier SA. The gates of the respective transfer gate transistors CT1 to CTn are connected to output terminals of the column decoder CD. The memory data of the cell transistor MCij (i=1 to m and j=1 to n) selected by means of the row decoder RD and the column decoder CD is supplied to the sense amplifier SA via the data line DLj when the transfer gate transistor CTj is turned on and is amplified by the sense amplifier SA. Further, the erasing gates of the cell transistors MCll to MCmn are all connected to an erasing line EL to which an output signal HE of an erasing circuit EC is supplied. The sources of the cell transistors MCll to MCmn are all connected to a source line SL to which an output signal VS of a source potential generation circuit VG is supplied. An erasing signal ER is supplied to the erasing circuit EC and the source potential generation circuit VG to control the operation of the same. The erasing signal ER is set at an "H" level in the erasing mode and at an "L" level in the data readout mode and data programming mode. The source potential generation circuit VG functions to determine the source potential of each of the memory cell transistors MCll to MCmn in the data readout mode, data programming mode and erasing mode. The source potential generation circuit VG is constructed by P-channel MOS transistors 11, 15 and 25 and N-channel MOS transistors 12, 16, 17, 19 to 21, 24, 26 to 28. The erasing signal ER is supplied to the input node of a CMOS inverter 13 constituted by the P-channel MOS transistor 11 and N-channel MOS transistor 12. The current paths between the sources and drains of the N-channel MOS transistors 16 and 17 are serially connected in series between the output node NA of the CMOS inverter 13 and the gate of the P-channel MOS transistor 15. The gate of the MOS transistor 16 is connected to a power source Vcc and the gate of the MOS transistor 17 is connected to a high voltage power source Vpp. The MOS transistors 16 and 17 function as a potential difference reducing circuit 18 for preventing the PN junction between the semiconductor substrate and the drains of the MOS transistors constituting the CMOS inverter 13 from being broken down at the time of application of a high voltage from the high voltage power source Vpp. The source of the MOS transistor 15 is connected to the high voltage power source Vpp and the current paths between the drains and sources of the N-channel MOS transistors 19 to 21 are connected in series between the drain of the MOS transistor 15 and a ground terminal Vss. The gate of the MOS transistor 19 is connected to the high voltage power source Vpp and the gate of the MOS transistor 20 is connected to the power source Vcc. Further, the gates of the MOS transistors 15 and 21 are connected together. Like the MOS transistors 16 and 17, the MOS transistors 19 and 20 constitute a potential difference reducing circuit 22 for preventing the PN junction between the semiconductor substrate and the drain of the MOS transistor 21 from being broken down. The MOS transistors 15, 19 to 21 basically constitute an inverter 23 and the output node NB thereof is connected to the gate of the N-channel MOS transistor 24. The current path of the P-channel MOS transistor 25 is connected between the gate of the MOS transistor 15 and the high voltage power source Vpp and the gate thereof is connected to the output node NB. Since the drain of the MOS transistor 15 and the gate of the MOS transistor 25 are connected together and the drain of the MOS transistor 25 and the gate of the MOS transistor 15 are connected together, the drain potential of the MOS transistor 15 can be fed back to the gate of the MOS transistor 25 to set the potential level of the output node NB completely to the Vpp level or 0 V. The drain of the MOS transistor 24 is connected to the high voltage power source Vpp and the current paths between the drains and sources of the N-channel MOS transistors 26 to 28 are connected in series between the source of the MOS transistor 24 and the ground terminal Vss. The gate of the MOS transistor 26 is connected to the high voltage power source Vpp and the gate of the MOS transistor 27 is connected to the power source Vcc. Further, the gate of the MOS transistor 28 is connected to the output node NA of the CMOS inverter 13. The MOS transistors 26 and 27 constitute a potential difference reducing circuit 29 for protecting the MOS transistor 28. The MOS transistors 24, 26 to 28 basically constitute an inverter 30 and the output node NC of the inverter 30 is connected to the source line SL.

Next, the operation of the circuit shown in FIG. 1 is explained with reference to FIG. 2. FIG. 2 shows the output signal VS of the source potential generation circuit VG, the potentials of the high voltage power source Vpp, nodes NA and NB, word line WL and data line DL, the output signal HE of the erasing circuit EC and the erasing signal ER in the data readout mode, data programming mode and erasing mode of memory device including the source potential generation circuit VG shown in FIG. 1.

In the data readout mode, a voltage of 5 V is supplied as an output voltage of the high power source voltage Vpp. The drain of the selected memory cell transistor MCij (i=1 to m and j=1 to n) is applied with 2 V via a data line DLj selected by the column decoder CD and the gate thereof is applied with 5 V via a word line WLi selected by the row decoder RD. The erasing signal ER is set at the "L" level (0 V), and the signal HE of 0 V (ground potential) is applied to the erasing gate of each of the memory cell transistors MCll to MCmn from the erasing circuit EC via the erasing line EL. In the source potential generation circuit VG, the "L" level of the erasing signal ER causes an output of the CMOS inverter 13 to be set to the "H" level (=5 V) and the gates of the MOS transistors 15 and 21 are applied with a voltage of "Vcc-$V_{TH}16$". $V_{TH}16$ is a threshold voltage of the MOS transistor 16. As a result, the MOS transistor 21 is turned on to lower the potential of the node NB, thus applying a feedback voltage to the gate of the MOS transistor 25. Therefore, the MOS transistor 25 is turned on to set the gate potential of the MOS transistor 15 to the Vpp level, thereby completely turning off the MOS transistor 15 and setting the potential of the node NB to 0 V. When the potential of the node NB becomes 0 V, the MOS transistor 24 is turned off. Further, since the output node NA of the CMOS inverter 13 is set at 5 V, the MOS transistor 28 is set in the ON state and the level of an output signal of the inverter 29 or the output signal VS of the source potential generation circuit VG is set to 0 V. As a result, the potential of the source line SL becomes 0 V and the source potential of each of the memory cell transistors MC ll to MCmn in the data readout mode is set to 0 V.

In the data programming mode, a voltage of 12 V is supplied as an output voltage of the high voltage power source Vpp. The drain of the memory cell transistor MCij selected is applied with 8 V via the data line DLj selected by the column decoder CD and the control gate thereof is applied with 12 V via the word line WLi selected by the row decoder RD. The erasing gate of each of the memory cell transistors MCll to MCmn is supplied with the signal HE of 5 V from the erasing circuit EC via the erasing line EL. Since the erasing signal ER is kept at the "L" level, the source potential generation circuit VG first applies a voltage of "Vcc- $V_{TH}16$" to the gates of the MOS transistors 15 and 21 in the same manner as in the readout mode. Since the source of the MOS transistor 15 is applied with $V_{pp}=12$ V, the MOS transistor 15 is not completely turned off. At this time, since the MOS transistor 21 is kept in the ON state, the potential of the node NB is set to a potential ("L" level) determined by the ratio of the conduction resistance of the MOS transistor 15 to the total sum of the conduction resistances of the MOS transistors 19 to 21. When the potential of the node NB is set to the "L" level, the MOS transistor 25 is turned on and the gate of the MOS transistor 15 is set to $V_{pp}=12$ V by the feedback operation, thereby completely turning off the MOS transistor 15. As a result, the potential of the node NB becomes 0 V, turning off the MOS transistor 24. Since the potential of the node NA is set at 5 V as in the readout mode, the MOS transistor 28 is turned on and the output signal VS is set to 0 V. Therefore, the source potential of each of the memory cell transistors MC11 to MCmn is set to 0 V.

In the data erasing mode, a voltage of 12 V is supplied as a voltage of the high voltage power source Vpp. Since all the bits (all the memory cell transistors MC11 to MCmn) of the memory cell array MCA are simultaneously erased in this embodiment, the control gates and the drains of all the memory cell transistors MC11 to MCmn are set to 0 V (ground potential) according to the outputs of the row decoder RD and the column decoder CD. Further, each of the erasing gates thereof is applied with the erasing signal HE of 20 V from the erasing circuit EC via the erasing line EL. The erasing signal HE of 20 V is created by raising an output voltage of the high voltage power source Vpp by use of a high voltage booster circuit (not shown), for example. Since the erasing signal ER is set to the "H" level, the output node NA of the CMOS inverter 13 is set to the "L" level in the source potential generation circuit VG, thereby turning on the MOS transistor 15 and turning off the MOS transistor 21. As a result, the potential of the output node NB of the inverter 23 is set to the Vpp level or 12 V. At this time, the MOS transistor 25 whose gate is connected to the node NB is set in the OFF state. Further, the MOS transistors 24 and 28 are respectively turned on and off. Therefore, the output signal VS of the source potential generation circuit VG becomes "$V_{pp}-V_{TH}24$". $V_{TH}24$ is a threshold voltage of the MOS transistor 24. Since a high voltage is applied to the gate and drain of the MOS transistor 24 and the MOS transistor 24 is operated with the substrate deeply biased, "$V_{pp}-V_{TH}24$" becomes 10 V if the threshold voltage $V_{HT}24$ of the MOS transistor 24 is 2 V. As a result, a voltage of 10 V is applied to the sources of all the memory cell transistors MC11 to MCmn.

As described above, a potential difference between the erasing gate (20 V) and the source region (10 V) becomes "20 V−10 V=10 V" in each of the memory cell transistors MC11 to MCmn in the erasing mode. If, in this way, the potential difference between the erasing gate and the source region is reduced, the electric field applied to the oxide film disposed between the erasing gate and the source region can be reduced to approximately 3.3 MV/cm even when the oxide film is formed with a thickness of 300 Å, for example. Therefore, it is not necessary to form a thick oxide film for enhancing the withstanding voltage between the erasing gate and the source region. The oxide film disposed between the erasing gate and the source region may be obtained by a combination of an oxide film grown on the source region in the step of forming a first gate oxide film (which is an oxide film formed between the channel region and the floating gate) of the memory cell transistor (for example, an oxide film is formed to a thickness of 500Å on an n+-type diffusion region used as the source region with high impurity concentration when the first gate oxide film is formed with a thickness of 300 Å) and an oxide film grown (but little) on the first gate oxide film in the step of forming a second gate oxide film (which is an oxide film formed between the floating gate and the erasing gate). Thus, the resultant oxide film of approximately 500 Å can be obtained and a sufficiently high withstanding voltage can be attained only by forming the erasing gate on the resultant oxide film. In this way, the dielectric breakdown characteristic of the insulation film between the erasing gate and the source region can be improved and the reliability of the nonvolatile semiconductor memory device can be enhanced without increasing the thickness of the oxide film between the erasing gate and the source region.

Further, there is no possibility that the thickness of the field oxide layer is significantly reduced when the thick oxide film formed between the erasing gate and the source region is selectively etched and a hollow-out portion is formed in the surface area of the substrate by etching the bird's beak portion. Therefore, it becomes possible to suppress fluctuation in the characteristics of the memory cell transistor and the leak between elements caused by etching the field oxide layer. Further, since the rate of rise in the voltage level of the node NA can be controlled by changing the charging capacity of the output node NA of the CMOS inverter 13, the discharging speed or the falling rate of the signal VS output from the source potential generation circuit VG can be controlled according to the required characteristics of the memory cell transistors.

In a case where a pattern for integrating the circuit of FIG. 1 is formed, the control gate electrode and source region patterns are alternately arranged in parallel with each other and the erasing gate electrode patterns are formed to intersect the control gate electrode and source region patterns. In this case, if the source wiring is formed of a diffusion layer and a source voltage is applied to the source wiring formed of the diffusion layer, it becomes difficult to stably set the source potential of that one of the memory cell transistors which are located far away from the source potential generation circuit VG since the diffusion resistance becomes relatively high. Therefore, a source wiring of aluminum is formed over the source region with an insulation film disposed therebetween and contact holes are selectively formed in the insulation film for connection between the source region and the source wiring so as to reduce the effective resistance of the source wiring. The source wiring may be formed of a second-layered aluminum wiring layer which is formed over a first-layered aluminum wiring layer connecting the drains together with an insulation film disposed therebetween. The pattern of the second-layered aluminum wiring layer is formed to intersect the pattern of the first-layered aluminum wiring layer. As a result, the resistance of the source wiring can be reduced and the source potential can be correctly set to a desired potential level.

FIG. 3 is a block diagram showing a nonvolatile semiconductor memory device according to a second embodiment of this invention. In the first embodiment, all the bits of the memory cell array MCA are simultaneously erased. However, in the second embodiment, the memory cell array MCA is divided into a plurality (k) of blocks the data stored in the memory cell is erased in unit of blocks. Source potential generation circuits VG-1 to VG-k and erasing circuits EC-1 to EC-k are provided for respective memory cell blocks BMC-1 to BMC-k. Each of the memory cell blocks BMC-1 to BMC-k includes memory cell transistors (not shown) arranged in a matrix form. The source lines of the memory cell transistors in each memory cell block are connected to a corresponding one of erasing lines SL1 to SLk. The source lines SL1 to SLk are independently provided for respective blocks BMC-1 to BMC-k and outputs VS1 to VSk of the source potential generation circuits VG-1 to VG-k are supplied via the respective source lines SL1 to SLk. Further, the erasing circuits EC-1 to EC-k are connected to a block erasing decoder circuit BED which generates outputs for selectively activating the erasing circuits, thus selecting at least one of the memory cell blocks BMC-1 to BMC-k for the erasing operation. In order to effect the erasing operation for each block, only the potential of the source line SLh (h=1 to k) of the block to be subjected to the erasing operation or only the output signal VSh of the source potential generation circuit VGh is raised to approximately 10 V and the potential of the source line of the block which are not subjected to the erasing operation is set to 0 V. Since the erasing gates in the block which is not subjected to the erasing operation is applied with 0 V and the source line potential is set to 0 V, stress applied to the block which is not subjected to the erasing operation can be suppressed to a minimum.

The construction of the source potential generation circuit VG is not limited to that shown in FIG. 1 and can be variously modified. For example, the potential difference reducing circuits 18, 22 and 29 in the source potential generation circuit VG of the first embodiment are formed of enhancement type MOS transistors 16, 17, 19, 20, 26 and 27. However, as shown in FIG. 4, they can be formed of depletion type MOS transistors 16D, 17D, 19D, 20D, 26D and 27D. With the construction as shown in FIG. 4, the operation and effect of the source potential generation circuit which is substantially the same as those of the source potential generation circuit VG shown in FIG. 1 can be attained.

FIG. 5 shows still another construction of the source potential generation circuit VG. In the circuit of FIG. 1, the conduction state of the MOS transistor 8 is controlled by the output of the CMOS inverter 13. However, in the circuit of FIG. 5, the conduction state of the MOS transistor 28 is controlled by the output of an inverter 31 connected to the node NB. Further, depletion type MOS transistors 19D, 20D, 26D and 27D are provided as the MOS transistors 19, 20, 6 and 27 constituting the potential difference reducing circuits 22 and 29. The inverter 31 includes a P-channel MOS transistor 32, depletion type MOS transistors 33D and 34D and an N-channel MOS transistor 35. The source and gate of the MOS transistor 32 are respectively connected to the high voltage power source Vpp and node NB. Further, the current paths of MOS transistors 33D, 34D and 35 are connected in series between the drain of the MOS transistor 32 and the ground terminal Vss. The MOS transistors 33D and 34D constitute a potential difference reducing circuit 36 for protecting the MOS transistor 35. The gates of the MOS transistors 33D and 34D are respectively connected to the high voltage power source Vpp and the power source Vcc. Further, the gate of the MOS transistor 35 is connected to the node NB. A connection node between the MOS transistors 32 and 33D which is an output node ND of the inverter 31 is connected to the gate of the MOS transistor 28.

Next, the operation of the circuit shown in FIG. 5 is explained. In the data readout mode and programming mode, the erasing signal ER is set at the "L" level (=0 V) and the potential of the output node NA of the CMOS inverter 13 is set at the "H" level. The potential of "H" level is transferred to the gates of the MOS transistors 15 and 21 via the current paths of the MOS transistors 16 and 17 which act as a transfer gate to turn off the MOS transistor 15 and turn on the MOS transistor 21. As a result, the potential of the node NB is set to the ground potential 0 V and the output of the inverter 31 is set to the "H" level, and then the potential of the node ND is set to 5 V to turn on the MOS transistor 28. Further, since the potential of the node NB is set at 0 V, the MOS transistor 24 is set in the OFF state and the output signal VS is set at 0 V. As a result, the source potential of the memory cell transistors MC11 to MCmn is also set to 0 V.

In the erasing mode, the erasing signal ER is set at the "H" level (=5 V), the potential of the node NA is set at the "L" level (=0 V), the potential of the node NB is set at the "H" level (=12 V) and the potential of the node ND is set at the "L" level (=0 V). Therefore, the MOS transistor 24 and 28 are respectively set in the ON and OFF states. As a result, the output signal VS of the source potential generation circuit VG is set to a potential level obtained by lowering a voltage of the high voltage power source Vpp MOS transistor 24. Assuming that the threshold voltage VTH 24 of the MOS transistor 24 is 2 V, then a voltage of "12 V−2 V=10 V" is applied to each of the sources of the memory cell transistors MC11 to MCmn, thereby reducing the potential difference between the erasing gate and the source region.

The feature of the circuit shown in FIG. 5 is that a voltage of 12 V is applied to the node ND. In general, when data "0" is programmed, hot electrons are generated to inject electrons into the floating gate. At this time, a programming current of several mA flows between the drain and source of the memory cell transistor. Therefore, in a memory device having an output of 8-bit construction, for example, a maximum current of tens of mA may flow. In order to drive the current of tens of mA by means of the MOS transistor 28, it is necessary for the MOS transistor 28 to have a large current driving ability, that is, a large pattern area becomes necessary. For example, when the gate potential of the MOS transistor 28 is set at 5 V and if channel length of the MOS transistor 28 is 3 $\mu$m, it becomes necessary to set the channel width thereof as large as approximately 1000 $\mu$m. As a result, the MOS transistor 28 will occupy a large area on the pattern layout. In the circuit of FIG. 5, since the gate voltage $V_G$ of the MOS transistor 28 is 12 V, the MOS transistor 28 will effect the triode operation. Therefore, when the threshold voltage VTH 28 of the MOS transistor 28 is 1 V, for example, the channel width of the MOS transistor 28 which is necessary for permitting the same current (tens of mA) to flow can be obtained as follows:

$$\frac{V_G(5V) - V_{TH}28}{V_G(12V) - V_{TH}28} = \frac{1}{2.75}$$

Thus, the channel width of the MOS transistor 28 is set to 360 μm and increase in the area occupied by the chip can be suppressed.

FIG. 6 shows the potentials of high voltage power source Vpp, output signal VS of the source potential generation circuit VG, nodes ND and NB, word line WL, data line DL, output signal HE of the erasing circuit EC and erasing signal ER in each of the operation modes of the circuit of FIG. 5.

Figures 7, 8:
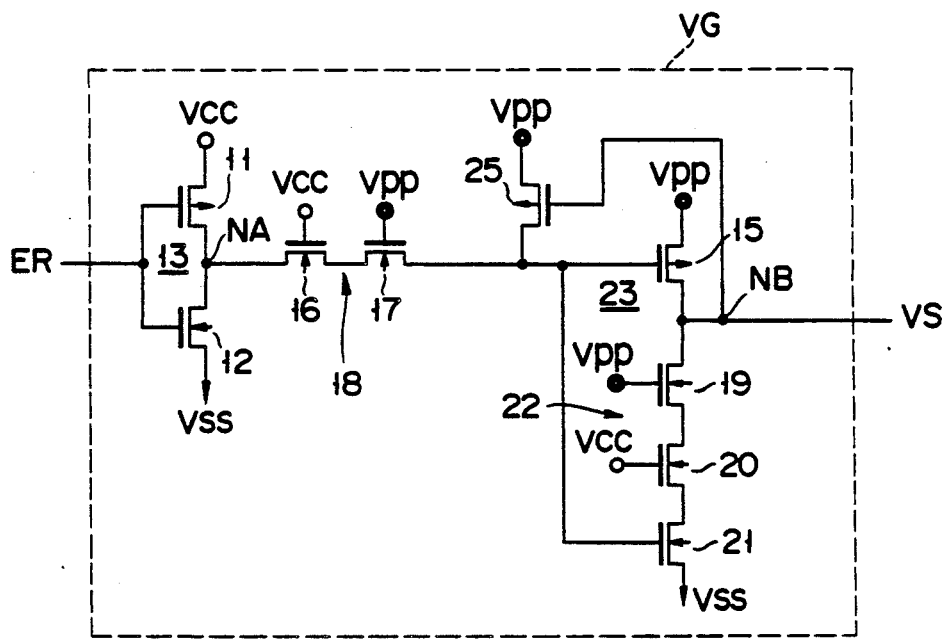
FIG. 7 is a circuit diagram showing a source potential generating circuit which is part of a nonvolatile semiconductor memory device according to a fifth embodiment of this invention and can be obtained by modifying the source potential generating circuit in the circuit shown in FIG. 1.
FIG. 8 is a diagram showing the relation between each operation mode and each signal and a potential at each node to illustrate the operation of the circuit shown in FIG. 7.

FIG. 7 shows another construction of the source potential generation circuit VG. The circuit of FIG. 7 is similar to that of FIG. 1 except that the MOS transistors 24, 26 to 28 are omitted and the potential of the node NB is used as the output signal VS of the circuit VG. The circuit of FIG. 7 may be used in a case where it is not necessary to lower the output potential of the source potential generation circuit VG by the threshold voltage $V_{TH}$ 24 of the MOS transistor 24, that is, it is used for memory cell transistors which permit the voltage (12 V) of the high voltage power source Vpp to be directly applied to the source line SL.

In the circuit of FIG. 7, the potentials of the control gate, drain and erasing gate of each of the memory cell transistors MC11 to MCmn are the same as those in the circuit of FIG. 1 in the data readout mode, programming mode and erasing mode and only the potential of the source line SL in the erasing mode is different. FIG. 8 shows the potentials of high voltage power source Vpp, output signal VS of the source potential generation circuit VG, word line WL, data line DL, output signal HE of the erasing circuit EC and erasing signal ER in each operation mode.

In the circuit of FIG. 7, the potential difference between the erasing gate and source region erasing mode becomes "20 V − 12 V = 8 V". For example, if the thickness of the oxide film disposed between the erasing gate and source region is 300 μm, the electric field applied thereto becomes approximately 2.7 MV/cm, making it further difficult to cause the dielectric breakdown of the oxide film and enhancing the reliability of the memory device.

FIG. 9 shows a source potential generation circuit VG whose discharging characteristic is improved over that of the source potential generation circuits described above. More specifically, the source potential generation circuit can be obtained by additionally providing a discharging characteristic control circuit connected to the output node of the source potential generation circuit VG of FIG. 1. The discharging characteristic control circuit 37 is controlled by the output of the CMOS inverter 13. That is, the output node NA of the CMOS inverter 13 is connected to the input node of a CMOS inverter 40 constituted by a P-channel MOS transistor 38 and an N-channel MOS transistor 39. The output node of the CMOS inverter 40 is connected to the input node of a CMOS inverter 43 constituted by a P-channel MOS transistor 41 and an N-channel MOS transistor 42. A capacitor 44 is connected between the output node of the CMOS inverter 40 and the ground terminal Vss. The output node of the CMOS inverter 43 is connected to the input node of a CMOS inverter 47 constituted by a P-channel MOS transistor 45 and an N-channel MOS transistor 46. A capacitor 48 is connected between the output node of the CMOS inverter 43 and the ground terminal Vss. The output node of the CMOS inverter 47 is connected to the gates of a P-channel MOS transistor 49 and an N-channel MOS transistor 50. A capacitor 51 is connected between the output node of the CMOS inverter 47 and the ground terminal Vss. Further, the current path between the source and drain of an P-channel MOS transistor 52 is connected between the power source Vcc and the source of the MOS transistor 49. The gate of the MOS transistor 52 is connected to receive the erasing signal ER. The drains of the MOS transistors 49 and 50 are connected together and the source of the MOS transistor 50 is connected to the ground terminal Vss. The current path between the drain and source of an N-channel MOS transistor 53 is connected between the ground terminal Vss and the drain common connection node (node NE) between the MOS transistors 49 and 50. The gate of the MOS transistor 53 is connected to receive the erasing signal ER. The current paths of N-channel MOS transistors 54 to 56 are connected in series between the ground terminal Vss and the output node of the source potential generation circuit VG or the drain common connection node (node NC) between the MOS transistors 24 and 26. The gate of the MOS transistor 54 is connected to the high voltage power source Vpp and the gate of the MOS transistor 55 is connected to the power source Vcc. The MOS transistors 54 and 55 constitute a potential difference reducing circuit 57 for protecting the MOS transistor 56. The gate of the MOS transistor 56 is connected to the node NE. The MOS transistors 49, 50 and 52 constitute an inverter 58 which is controlled by the erasing signal ER. The inverter 58 is set in the active state (to effect the inverting operation) when the erasing signal ER is at the "L" level and set in the nonactive state when the erasing signal ER is at the "H" level. The inverters 40, 43, 47 and 58 and the capacitors 44, 48 and 51 constitute a delay circuit 59 for delaying the rising operation of the potential of the node NA when the erasing signal ER is changed from the "H" level to the "L" level. The transition from the OFF state to the ON state of the MOS transistor 56 is delayed by means of the delay circuit 59. When the erasing signal ER is changed from the "L" level to the "H" level, the MOS transistors 52 and 53 are respectively turned off and on, thereby causing the potential of the node NE to be rapidly set to the "L" level to turn off the N-channel MOS transistor 56 at high speed.

Figure 10:
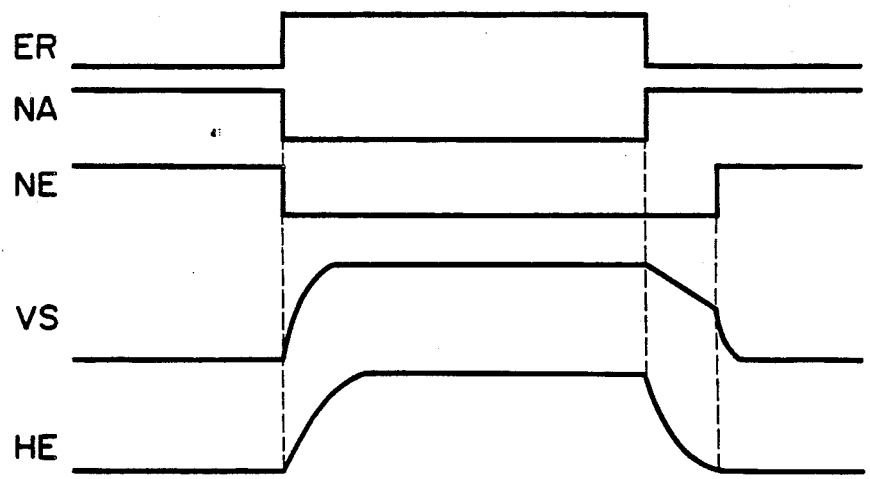
FIG. 10 is a timing chart of various signals and potentials of various nodes in the circuit of FIG. 9.

FIG. 10 is a timing chart of the erasing signal ER, potentials of the nodes NA and NE, signals VS and HE in the circuit of FIG. 9 and output signal HE.

In the circuit of FIG. 9, the MOS transistors 28 and 56 are formed to have different current driving abilities (discharging abilities). More specifically, the current driving ability of the MOS transistor 56 is set to be larger than that of the MOS transistor 28. Further, the potential of the output signal VS is set to vary according to variation in the potential level of the signal HE. This is done to prevent the effect of reducing the electric field applied to the oxide film between the erasing gate and source region from being degraded when imbalance occurs between the rising and falling characteristics of the potential (=potential of the signal HE) of the erasing gate and those of the source region. For example, at the initial time of the erasing operation, the signals HE and VS start to rise at the same time as the rise of the erasing signal ER. However, in this case, if the signal HE has risen before the signal VS rises, a strong electric field is applied to the oxide film between the erasing gate and source region before the signal VS rises. Further, the signals HE and VS start to fall at the same time as the fall of the erasing signal ER at the time of completion of the erasing operation. However, in this case, if the signal VS has rapidly fallen before the signal HE falls, a strong electric field is applied to the oxide film until the signal HE becomes sufficiently low. Thus, the effect obtained by application of the the signal VS to the respective source regions of the memory cell transistors may be reduced. Therefore, it becomes necessary to set the signal VS to rise before the signal HE rises and set the signal VS to fall after the signal HE has fallen. In this case, the rising characteristic of the signal VS may not incur any problem. This is because the signal HE is required to charge all the erasing gates of the memory cell transistors MC or a capacitor of large capacitance so that the rate of rising thereof will become low. Further, since the charging operation is slowly effected by use of a high voltage booster circuit (not shown), the rate of rising thereof will become lower. In contrast, in order to delay the fall of the signal VS with respect to the fall of the signal HE but not by an excessively long time, the MOS transistor 28 (for example, the channel width thereof is 200 µm when the channel length thereof is 3 µm) having a slightly small current driving ability and the MOS transistor 56 (for example, the channel width thereof is 1000 µm when the channel length 3 µm) having a larger current driving ability are used to permit discharging operations in two steps with a preset time delay. That is, the MOS transistor 28 is first turned on to gradually discharge the output node and then the MOS transistor 56 is turned on to rapidly discharge the output node after a preset delay time determined by the delay circuit 59. In this way, the potential of the signal VS starts to be gradually lowered with a delay time with respect to the potential of the signal HE so that the fall of the potential of the signal VS can be delayed behind the fall of the potential of the signal HE but not by an excessively long time and the potential of the signal VS can be adequately discharged.

A desired delay characteristic of the delay circuit 59 can be attained by selectively setting the current driving abilities and the number of inverters, the capacitances and the number of capacitors, parasitic resistance and parasitic capacitance.

With the source potential generation circuit VG with the construction shown in FIG. 9, a strong electric field can be prevented from being applied to the oxide film between the erasing gate and the source region even when the erasing signal ER is changed. Therefore, even in the transition time of the erasing signal ER, the operation can be stably effected, thus enhancing the reliability.

Figure 11:
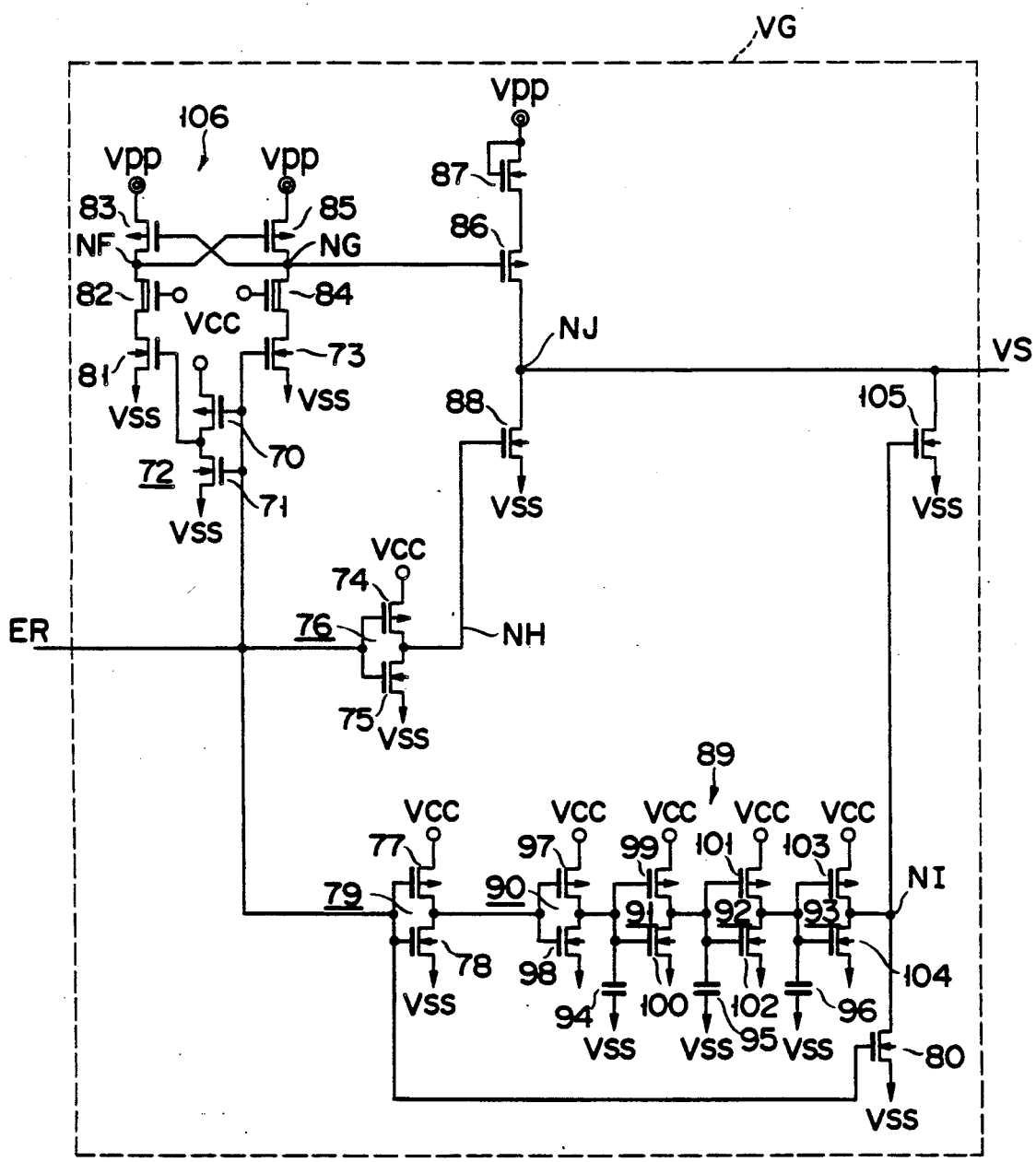

FIGS. 11 to 13 show other constructions of the source potential generation circuit VG shown in FIG. 1.

First, the construction of the source potential generation circuit VG shown in FIG. 11 is explained. The erasing signal ER is supplied to the input node of a CMOS inverter 72 constituted by a P-channel MOS transistor 70 and an N-channel MOS transistor 71, the gate of an N-channel MOS transistor 73, the input node of a CMOS inverter 76 constituted by a P-channel MOS transistor 74 and an N-channel MOS transistor 75, the input node of a CMOS inverter 79 constituted by a P-channel MOS transistor 77 and an N-channel MOS transistor 78, and the gate of an N-channel MOS transistor 80. The output node of the CMOS inverter 72 is connected to the gate of an N-channel MOS transistor 81. The source of the MOS transistor 81 is connected to the ground terminal Vss and the current paths of a depletion type MOS transistor 82 and a P-channel MOS transistor 83 are connected in series between the drain thereof and the high voltage power source Vpp. The source of the MOS transistor 73 is connected to to the ground terminal Vss and the current paths of a depletion type MOS transistor 84 and a P-channel MOS transistor 85 are connected in series between the drain thereof and the high voltage power source Vpp. The gates of the MOS transistors 82 and 84 are connected to the power source Vcc. The gate of the MOS transistor 83 is connected to the common connection node (node NG) between the MOS transistors 84 and 85 and the gate of the MOS transistor 85 is connected to the common connection node (node NF) between the MOS transistors 82 and 83. The node NG is also connected to the gate of a P-channel MOS transistor 86. The current path between the source and drain of a N-channel MOS transistor 87 whose gate is connected to the high voltage power source Vpp is connected between the source of the MOS transistor 86 and the high voltage power source Vpp. Further, the current path between the source and drain of an N-channel MOS transistor 88 whose gate is connected to the output node NH of the CMOS inverter 76 is connected between the drain of the MOS transistor 86 and the ground terminal Vss. The output node of the CMOS inverter 79 is connected to the input terminal of a delay circuit 89. The delay circuit 89 is constituted by four CMOS inverters 90 to 93 and three capacitors 94 to 96. That is, the output node of the CMOS inverter 79 is connected to the input node of the CMOS inverter 90 constituted by a P-channel MOS transistor 97 and an N-channel MOS transistor 98. The output node of the CMOS inverter 90 is connected to the input node of the CMOS inverter 91 constituted by a P-channel MOS transistor 99 and an N-channel MOS transistor 100. Further, the capacitor 94 is connected between the output node of the CMOS inverter 90 and the ground terminal Vss. The output node of the CMOS inverter 91 is connected to the input node of the CMOS inverter 92 constituted by a P-channel MOS transistor 101 and an N-channel MOS transistor 102. The capacitor 95 is connected between the output node of the CMOS inverter 91 and the ground terminal Vss. The output node of the CMOS inverter 92 is connected to the input node of the CMOS inverter 93 constituted by a P-channel MOS transistor 103 and an N-channel MOS transistor 104. The capacitor 96 is connected between the output node of the CMOS inverter 92 and the ground terminal Vss. The output node NI of the CMOS inverter 93 is connected to the drain of the MOS transistor 80 and the gate of an N-channel MOS transistor 105. The source of the MOS transistor 80 is connected to the ground terminal Vss and the current path between the drain and source of the MOS transistor 105 is connected between the ground terminal Vss and the common connection node (node NJ) between the MOS transistors 86 and 88. An output signal VS is derived from the node NJ.

In the circuit of FIG. 11, the MOS transistor 86 is used to charge the output node NJ and the MOS transistors 88 and 105 are used to discharge the output node NJ. The conduction state of the charging MOS transistor 86 is controlled by the output of a switching circuit 106 which is constituted by MOS transistors 70, 71, 73, 81 to 85, for switching the potential of the node NG between the potential of the high voltage power source Vpp and the potential (0 V) of the ground terminal Vss according to the level of the erasing signal ER. The discharging MOS transistor 88 is designed to have a small current driving ability and the discharging MOS transistor 105 is designed to have a large current driving ability. The conduction state of the MOS transistor 88 having a small current driving ability is controlled by an output signal of the CMOS inverter 76 at high speed. When the erasing signal ER rises from the "L" level to the "H" level, the MOS transistor 80 is turned on so that the MOS transistor 105 having a large current driving ability can be turned off at high speed. In contrast, when the erasing signal ER falls from the "H" level to the "L" level, the MOS transistor 105 is gradually turned on with a preset delay time because of the presence of the delay circuit 89.

Next, the operation of the circuit shown in FIG. 11 is explained in detail. When the erasing signal ER is set to the "H" level in the erasing mode, the output node NG of the switching circuit 106 is set to the "L" level (ground potential) and the MOS transistor 86 is turned on. Since the potential of the output node NH of the CMOS inverter 76 is set to the "L" level, the MOS transistor 88 is turned off. Further, since the MOS transistor 80 is turned on, the MOS transistor 105 is turned off. As a result, the output node NJ is charged from the high voltage power source Vpp via the current paths of the MOS transistors 87 and 86. The potential of the output node NJ or the potential of the output signal VS is lowered by the threshold voltage $V_{TH}87$ of the N-channel MOS transistor 87 so as to be set to "Vpp-$V_{TH}87$".

If an intrinsic type MOS transistor having a threshold voltage of substantially 0 V is used as the MOS transistor 87 or if the MOS transistor 87 is omitted, the potential of the high voltage power source Vpp can be output as it is. Further, if a plurality (x number) of MOS transistors whose gates and drains are connected together are connected in series between the source of the MOS transistor 86 and the high voltage power source Vpp, the potential of the output signal VS can be set to "Vpp-$xV_{TH}$".

When the erasing signal ER is set to the "L" level after the erasing operation is completed, the potential of the node NG is set to the "H" level (Vpp) and the MOS transistor 86 is turned off. The output of the CMOS inverter 76 is set to the "H" level and the MOS transistor 88 is turned on to start the operation of discharging the node NJ. In this case, since the current driving ability of the MOS transistor 88 is small, the node NJ is gradually discharged. At this time, since the MOS transistor 80 is turned off, the potential of the node NI is set to the "H" level with a time delay determined by the delay circuit 89. As a result, the MOS transistor 105 is turned on and the node NJ is discharged via the MOS transistor 105 which has a large current driving ability. With the above construction, the node NJ is gradually discharged at the initial stage via the MOS transistor 88 which has a small current driving ability and then rapidly discharged by means of a combination of the MOS transistor 88 and the MOS transistor 105 which has a large current driving ability after a delay time determined by the delay circuit 89 has elapsed. Therefore, the potential of the source line SL is lowered before the the erasing gate is fully discharged, thus preventing a strong electric field from being applied to an insulation film disposed between the erasing gate and the source region. Further, since the MOS transistors 88 and 105 are turned on with a time delay to permit the discharging operation, a peak current flowing in the operation of discharging the node NJ can be suppressed. The operation of charging the node NJ or the source line SL is effected at a speed higher than the signal HE supplied to the erasing gate rises.

In the circuit of FIG. 11, the delay circuit 89 is constructed by the four CMOS inverters 90 to 93 and the three capacitors 94 to 96. However, the delay circuit can be formed with another construction.

In the circuit of FIG. 12, the MOS transistor 105 in the circuit shown in FIG. 11 is controlled in a different manner. That is, in the circuit of FIG. 11, the MOS transistor 105 is turned on by a signal which is obtained by delaying the erasing signal ER, but in the circuit of FIG. 12, the MOS transistor 105 is turned on when a decrease in the potential of the node NJ is detected. That is, the MOS transistor 105 is turned on in response to a signal corresponding to the NOR value of the erasing signal ER and the potential of the node NJ. The erasing signal ER is supplied to the gates of a P-channel MOS transistor 107 and an N-channel MOS transistor 108. The drains of the MOS transistors 107 and 108 are connected together, and the current path between the drain and source of a P-channel MOS transistor 128 is connected between the source of the MOS transistor 107 and a power source Vcc. The source of the MOS transistor 108 is connected to a ground terminal. The current path between the drain and source of a P-channel MOS transistor 109 is connected between the ground terminal Vss and the drain common connection node (node NK) of the MOS transistors 107 and 108. The gates of the MOS transistors 128 and 109 are connected to the node NJ. The node NK is connected to the input node of a CMOS inverter 112 constituted by a P-channel MOS transistor 110 and an N-channel MOS transistor 111. The output node of the CMOS inverter 112 is connected to the input node of the CMOS inverter 79.

With the above construction, the operation of charging the node NJ in the erasing mode is effected in the same manner as in the circuit of FIG. 11. When the erasing mode is completed and the erasing signal ER is set to the "L" level, the potential of the output node NG of a switching circuit 106 is set to the "H" level (Vpp level), turning off the MOS transistor 86. At the same time, the potential of the output node NH of the CMOS inverter 76 is set to the "H" level and the MOS transistor 88 is turned on, causing the potential of the node NJ to be set towards the lower level. When the potential of the node NJ is high, the MOS transistors 128 and 109 are respectively set in the OFF and ON states so that the potential of the node NK will be set at the "L" level. Therefore, the potential of the output node of the CMOS inverter 112 is set to the "H" level to turn on the MOS transistor 80. As a result, the potential of the node NI is set to the "L" level to turn off the MOS transistor 105.

After the MOS transistor 88 is turned on, the potential of the node NJ is gradually lowered, and when it reaches approximately 1 V, the MOS transistors 128 and 109 are respectively turned on and off. At this time, since the erasing signal ER is at the "L" level, the MOS transistors 107 and 128 are respectively turned on and off to set the potential of the node NK to the "H" level. As a result, the potential of the output node of the CMOS inverter 112 is set to the "L" level to turn off the MOS transistor 80. After the delay time determined by the delay circuit 89 has elapsed, the potential of the node NI is set to the "H" level to turn on the MOS transistor 105, thereby causing the node NJ to be rapidly discharged.

With the above construction, since the discharging operation by the MOS transistor 105 is controlled based on the potential of the node NJ, the operation of discharging the node NJ by means of the MOS transistor 05 can be stably controlled without receiving any influence due to variation in the element parameters caused by fluctuation in the threshold voltages of the MOS transistors 97 to 104 which constitute the delay circuit 89.

FIG. 13 shows a circuit in which the discharging characteristic of the node NJ in the circuit of FIG. 12 is improved. That is, the current path between the drain and source of an N-channel MOS transistor 113 is connected between the node NJ and the ground terminal Vss and the gate thereof is connected to the output node NL of the CMOS inverter 79. The MOS transistor 113 is designed to have a current driving ability between those of the MOS transistors 88 and 105.

With the above construction, the operation of charging the node NJ in the erasing mode and the operation after the erasing mode is completed and the MOS transistor 88 is turned on until the node NJ starts to be discharged are effected in the same manner as in the circuit of FIG. 12. When the MOS transistor 88 is turned on and the potential of the node NJ starts to be lowered and reaches approximately 1 V, the MOS transistors 128 and 109 are respectively turned on and off. At this time, since the erasing signal ER is at the "L" level, the MOS transistors 107 and 108 are respectively turned on and off to set the potential of the node NK to the "H" level. As a result, the potential of the output node of the CMOS inverter 112 is set to the "L" level to turn off the MOS transistor 80. When the potential of the output node NL of the CMOS inverter 79 is set to the "H" level after the potential of the output node of the CMOS inverter 112 is set to the "L" level, the MOS transistor 113 is turned on. As a result, the node NJ is rapidly discharged. Further, when the potential of the node NI is set to the "H" level after the delay time determined by the delay circuit 89 has elapsed, the MOS transistor 105 is turned on, thereby causing the node NJ to be more rapidly discharged.

With the above construction, the MOS transistor 113 is kept in the ON state to continuously discharge the node NJ from the time when the MOS transistor 88 is turned on to start the operation of discharging the node NJ until the MOS transistor 105 is turned on to accelerate the operation of discharging the node NJ. Therefore, in the circuit of FIG. 13, the node NJ is discharged at increasing speeds changed at preset timings by means of the three MOS transistors 88, 113 and 105.

The construction of FIG. 13 is preferably used for a memory device of a large memory capacity (particularly, equal to or more than 1 Mbits). In a memory device with a memory capacity of 1 Mbits, for example, the capacitance of the sources of the memory cells will become 400 to 500 pF and the peak current at the discharging time will be tens of mA even if the node NJ is discharged at two stages as shown in FIG. 12. However, in the circuit of FIG. 13, the peak current will be several mA even if the capacitance is hundreds of pF and the peak current can be suppressed to attain a stable operation.

Figure 14:
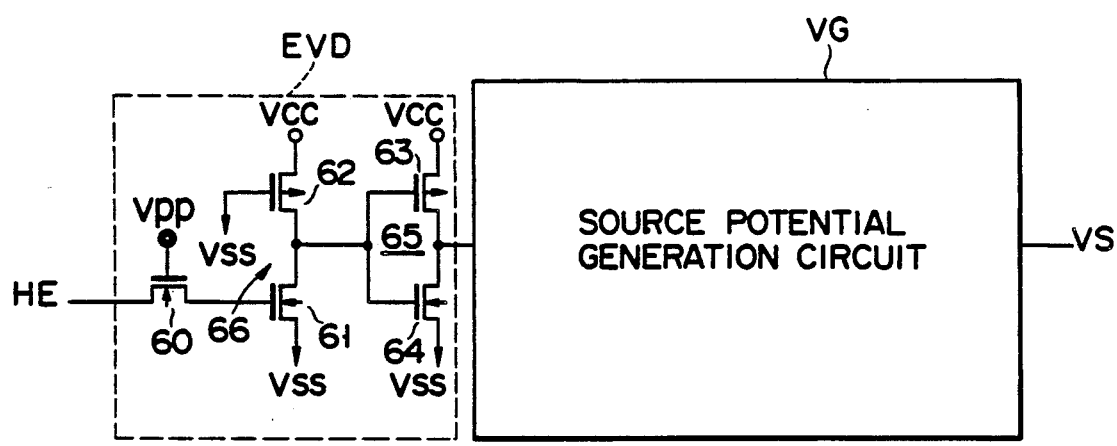
FIGS. 14 to 16 are circuit diagrams of nonvolatile semiconductor memory devices according to tenth to twelfth embodiments of this invention.
Figure 15:
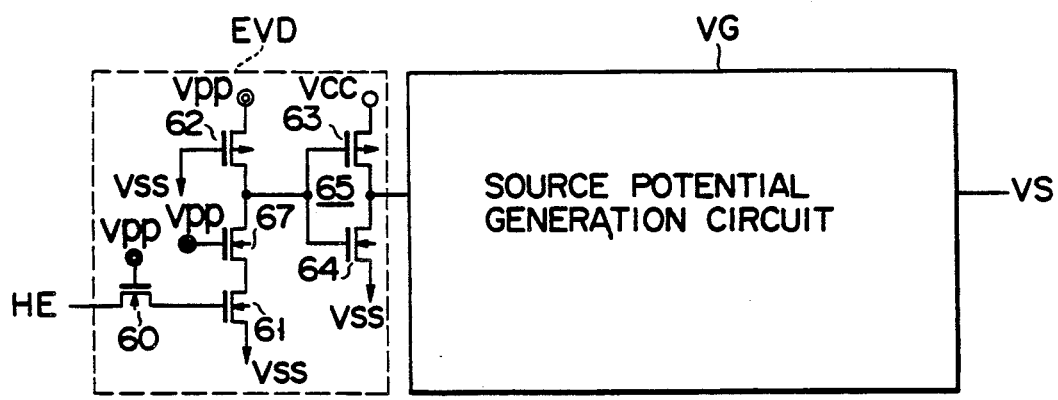
Figure 16:
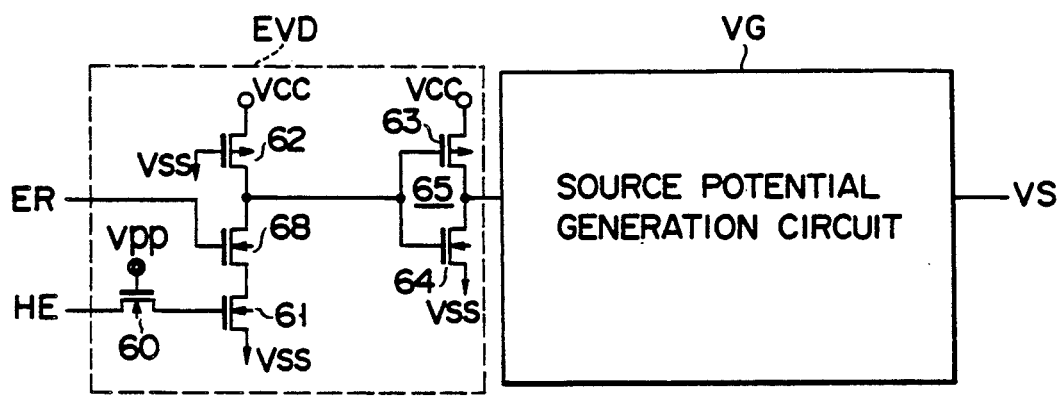
Figure 17:
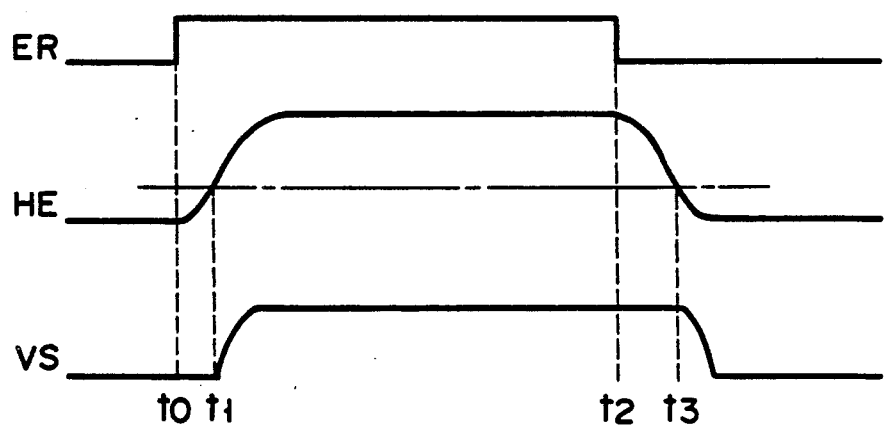
FIG. 17 is a timing chart for illustrating the operation of the circuits shown in FIGS. 14 to 16.

FIGS. 14 to 16 are circuit diagrams of nonvolatile semiconductor memory devices according to tenth to twelfth embodiments of this invention. FIG. 17 is a timing chart for illustrating the operation of the circuits shown in FIGS. 14 to 16. In the above embodiments, the source potential generation circuit VG is controlled by the erasing signal ER. However, in the embodiments of FIGS. 14 to 16, the source potential generation circuit VG is controlled by an output signal HE of an erasing circuit EC. That is, in the circuit of FIG. 14, the input node of the source potential generation circuit VG is connected to an erasing gate potential detection circuit EVD for detecting variation in the potential level of the signal HE. The detection circuit EVD is constituted by P-channel MOS transistors 2 and 63 and N-channel MOS transistors 60, 61 and 64. An output signal HE of the erasing circuit EC is supplied to one end of the current path of a MOS transistor 60 whose gate is connected to the high voltage power source Vpp. The other end of the current path of the MOS transistor 60 is connected to the gate of a MOS transistor 61 whose source is connected to the ground terminal Vss. The MOS transistor 60 is an electric field reduction MOS transistor for protecting the MOS transistor 61 from being broken down by application of a high voltage to the gate thereof. The current path between the source and drain of a MOS transistor 62 is connected between the drain of the MOS transistor 61 and the power source Vcc and the gate thereof is connected to the ground terminal Vss. The drain common connection node of the MOS transistors 61 and 62 is connected to the input node of a CMOS inverter 65 constituted by MOS transistors 63 and 64 and the output node thereof is connected to the input node of the source potential generation circuit VG.

With the above construction, detection of variation in the potential of the signal HE is determined by the ratio of an inverter 66 constituted by the MOS transistors 61 and 62. When the gate of the MOS transistor 61 is 8 V to 10 V, the CMOS inverter 65 at the next stage is operated. That is, when the erasing signal ER is set to the "H" level at the starting time of the erasing operation (time t0), the erasing circuit EC and a high voltage booster circuit (not shown) are operated to gradually raise the potential of the signal HE. When the signal HE rises to approximately 8 to 10 V, the source potential detection circuit EVD determines that the erasing mode is set and the source potential generation circuit VG is operated at time t1 to raise the signal VS to 10 V. At the completion of the erasing operation, the erasing signal ER is set to the "L" level (time t2) and the signal HE is gradually lowered. When the signal HE becomes lower than 8 to 10 V, decrease in the erasing potential is detected by the source potential detection circuit EVD and the source potential generation circuit VG is operated at time t3 to set the output voltage VS to 0 V. In this way, the source potential generation circuit VG can be controlled according to the output signal HE of the erasing circuit EC.

FIG. 15 shows another construction of the erasing gate potential detection circuit EVD. The circuit is obtained by replacing the inverter 66 in the circuit of FIG. 14 by an inverter which is operated on a voltage of the high voltage power source Vpp. That is, the source and gate of the MOS transistor 62 are respectively connected to the high voltage power source Vpp and ground terminal Vss. The current paths between the source and drain of N-channel MOS transistors 67 and 61 are connected in series between the drain of the MOS transistor 62 and the ground terminal Vss. The gates of the MOS transistors 67 and 61 are respectively connected to the high voltage power source Vpp and the other end of the current path of the MOS transistor 60. The drain common connection node of the MOS transistors 62 and 67 is connected to the input node of the CMOS inverter 65. The MOS transistor 67 is an electric field reduction MOS transistor for protecting the PN junction between the drain region and the semiconductor substrate of the MOS transistor 61 from being broken down when a high voltage is applied to the drain thereof. The MOS transistor 67 may be formed of depletion type.

With the construction shown in FIG. 15, substantially the same operation and effect as those of the circuit shown in FIG. 14 can be attained.

FIG. 16 shows still another construction of the erasing gate potential detection circuit EVD. The circuit is obtained by connecting the current path of a MOS transistor 68 whose conduction state is controlled by the erasing signal ER to the current path between the MOS transistors 61 and 62 of the circuit of FIG. 14. The input node of the CMOS inverter 65 is connected to the drain common connection node of the MOS transistors 62 and 68.

The circuit of FIG. 16 derives a logical sum of the erasing signal ER and signal HE to drive the source potential generation circuit VG based on the derived logical sum. Only when the signal HE is 8 to 10 V or more and the erasing signal ER is at the "H" level, the circuit VG is operated. With this construction, the detection circuit EVD in the data readout mode and programming mode can be prevented from being erroneously operated. In particular, when the signal HE is set to 5 V in the data programming mode and if the detection circuit EVD is erroneously operated, the signal VS is not set to 0 V but set to 10 V. Therefore, data cannot be correctly programmed. However, with the circuit construction shown in FIG. 16, the erroneous operation described above can be prevented.

With the circuit of FIG. 16, the source of the MOS transistor 62 is connected to the power source Vcc. However, it is also possible to connect the source of the MOS transistor 62 to the high voltage power source Vpp as in the circuit of FIG. 15.

Any one of the source potential generation circuits shown in FIGS. 1, 4, 5, 7, 9, 11 to 13 can be used as the source potential generation circuit VG shown in FIGS. 14 to 16. Further, in the above embodiments, an enhancement type MOS transistor is used as the electric field reduction MOS transistor 60, but it is possible to use a depletion type MOS transistor.

FIG. 18 is a circuit diagram showing a nonvolatile semiconductor memory device according to a thirteenth embodiment of this invention. Like the circuit of FIG. 3, the circuit of FIG. 18 has a memory cell array MCA which is divided into k memory cell blocks BMC-1 to BMC-k. In the circuit of FIG. 3, the erasing circuits EC-1 to EC-k and the source potential generation circuits VG-1 to VG-k are provided for the respective memory cell blocks BMC-1 to BMC-k. However, in the circuit of FIG. 18, erasing circuits EC-1 to EC-k are provided for the respective memory cell blocks BMC-1 to BMC-k and a source potential generation circuit VG is commonly provided for the memory cell blocks BMC-1 to BMC-k.

That is, the memory cell blocks BMC-1 to BMC-k are formed by dividing the memory cell array MCA into k sections for each group of a plurality of word lines. The erasing circuits EC-1 to EC-k are provided for the respective memory cell blocks BMC-1 to BMC-k and the erasing operation for each block or the simultaneous erasing operation for all the blocks can be effected by selecting the erasing circuits EC-1 to EC-k by use of a block erasing decoder circuit BED. Further, erasing gate potential detection circuits EV-1 to EV-k for detecting the potentials of the erasing gates of memory cell transistors MC are provided for the respective memory cell blocks BMC-1 to BMC-k. The circuits EV-1 to EV-k are connected to a common bus line CBL to which a preset bias voltage is applied from a bias circuit EBC. The bus line CBL is connected to the input node of an inverter 114 and the output node of the inverter 114 is connected to a first control input terminal of the source potential generation circuit VG. A second control input terminal of the circuit VG is supplied with the erasing signal ER and the output signal VS thereof is supplied to the sources of the memory cell transistors MC of the respective memory cell blocks BMC-1 to BMC-k.

Figure 19:
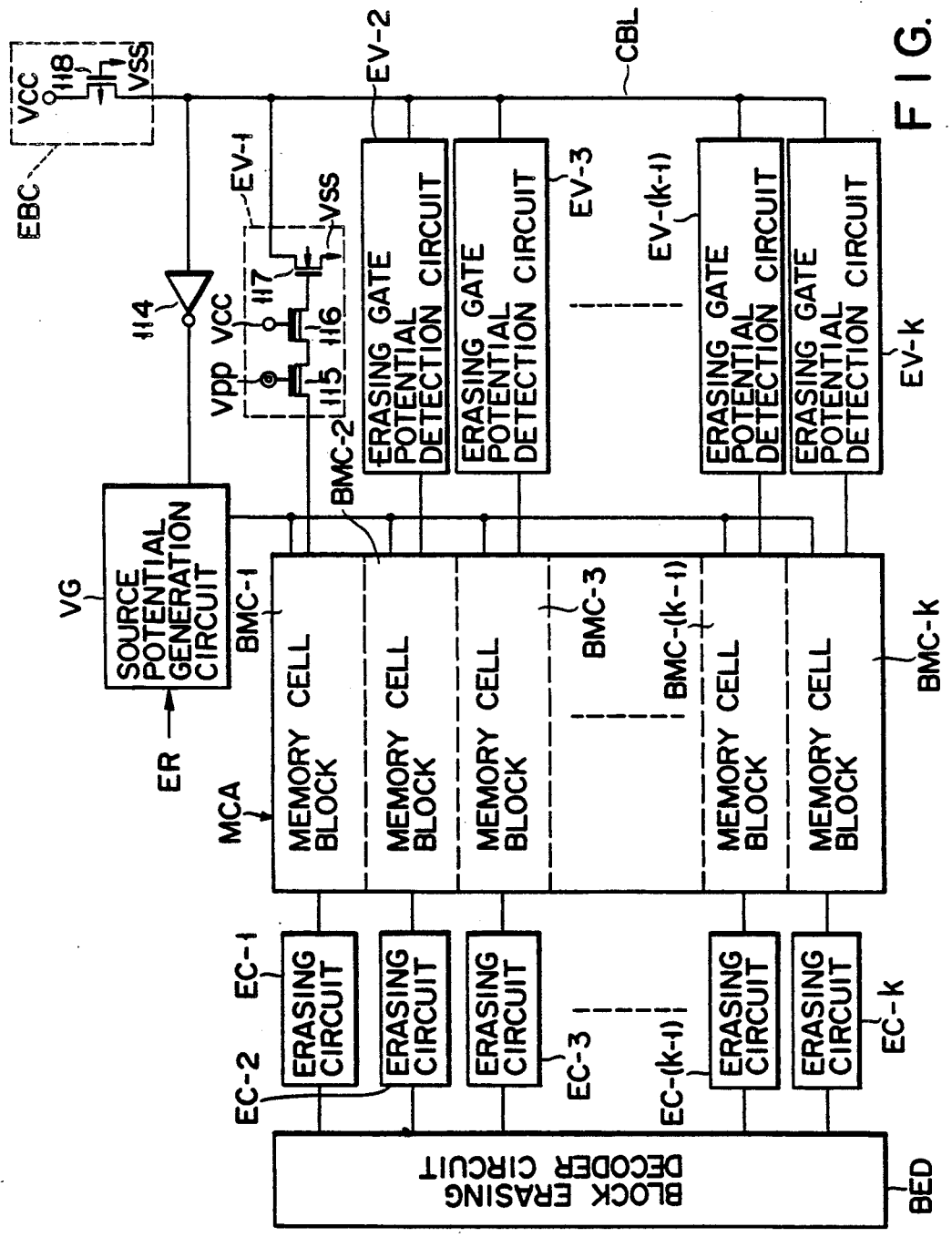
FIG. 19 shows the constructions of a bias circuit and a erasing gate potential detection circuit in the circuit of FIG. 18.

FIG. 19 shows the constructions of the bias circuit EBC and the erasing gate potential detection circuit EV-1 in the circuit of FIG. 18. In FIG. 19, the construction of the erasing gate potential detection circuit EV-1 is shown as an example, but the erasing gate potential detection circuits EV-2 to EV-k are formed to have substantially the same construction. The erasing gate potential detection circuit EV-1 includes depletion type MOS transistors 115 and 116 and an N-channel MOS transistor 117. The current path of the MOS transistor 115 is connected at one end to an erasing line EL in the memory cell block BMC-1 and the gate thereof is connected to the high voltage power source Vpp. The current path of the MOS transistor 116 is connected at one end to the other end of the current path of the MOS transistor 115 and the gate thereof is connected to the power source Vcc. The source, drain and gate of the MOS transistor 117 are respectively connected to the ground terminal Vss, the common bus line CBL and the other end of the current path of the MOS transistor 116.

The bias circuit EBC includes a P-channel MOS transistor 118. The source, drain and gate of the MOS transistor 118 are respectively connected to the power source Vcc, the common bus line CBL and the ground terminal Vss. The MOS transistor is normally kept in the ON state.

FIG. 20 shows the construction of the source potential generation circuit VG in the circuit of FIG. 18. The circuit VG is controlled by the erasing signal ER and an output signal SHE of the inverter 114 which corresponds to an output of the erasing gate potential detection circuits EV-1 to EV-k. The basic circuit construction of the circuit VG is similar to that shown in FIG. 13, and the same portions are denoted by the same reference numerals and the explanation thereof is omitted. In the circuit of FIG. 20, the erasing signal ER is supplied to the gates of a P-channel MOS transistor 119 and an N-channel MOS transistor 120. The source of the MOS transistor 119 is connected to the power source Vcc and the current path between the drain and source of the MOS transistor 120 and that of an N-channel MOS transistor 121 are connected in series between the drain of the MOS transistor 119 and the ground terminal Vss. The current path between the drain and source of P-channel MOS transistor 122 is connected between the power source Vcc and the drain common connection node of the MOS transistors 119 and 120. The signal SHE is supplied to the gates of the MOS transistors 121 and 122 and the input node of the CMOS inverter 76. Further, the drain common connection node of the MOS transistors 119 and 120 is connected to the input node of a CMOS inverter 125 constituted by a P-channel MOS transistor 123 and an N-channel MOS transistor 124. The output node of the CMOS inverter 125 is connected to the gate of the CMOS inverter 72 and the gate of the MOS transistor 73.

Now, the operation of the circuits shown in FIGS. 18 to 20 will be explained. In the erasing mode, an output of the erasing circuit EC-h (h=1 to k) selected by the block erasing decoder circuit BED is set to the "H" level. As a result, the output signal HE of the booster circuit is applied to the erasing gates of the memory cell transistors MC in the corresponding memory cell block BMC-h. When the potential is detected by the erasing gate potential detection circuit EV-h, the voltage of the common bus line CBL is lowered. That is, the voltage of the signal HE level is applied to the gate of the MOS transistor 117 via the current paths of the MOS transistors 115 and 116 in the detection circuit EV-h. As a result, the MOS transistor 117 is turned on to lower the potential of the common bus line CBL. When the potential of the common bus line CBL becomes lower than the circuit threshold voltage (for example, 2 V) of the inverter 114, the output signal SHE of the inverter 114 is set to the "H" level, causing the circuit VG to be operated.

The source potential generation circuit VG shown in FIG. 20 effects the following operation. In the data readout mode or programming mode, the erasing signal ER and the output signal SHE of the inverter 114 are both set at the "L" level. In this state, the MOS transistors 121 and 122 are respectively set in the OFF and ON states, thereby setting the potential of the input node of the CMOS inverter 125 to the "H" level. As a result, the potential of the output node of the inverter 125 is set to the "L" level and the potential of the node NG is set to the "H" level. At the same time, the potential of the output node NH of the CMOS inverter 76 is set to the "H" level. As a result, the MOS transistors 86 and 88 are respectively turned off and on to set the potential of the output node NJ to the ground potential Vss. In this state, the MOS transistors 128 and 109 are respectively set in the ON and OFF states and the erasing signal ER is set at the "L" level so that the potential of the node NK can be set to the "H" level. Therefore, the potentials of the nodes NL and NI are set at the "H" level and the MOS transistors 113 and 105 are set in the ON state.

When the erasing signal ER is set at the "H" level in the erasing mode and the output signal SHE of the inverter 114 is still set at the "L" level, the MOS transistors 121 and 122 are respectively set in the OFF and ON states. As a result, an output of the CMOS inverter 125 is set to the "L" level. Further, since the signal SHE is set at the "L" level, the potential of the output node NH of the CMOS inverter 76 is set to the "H" level. Therefore, the erasing signal ER and signal SHE are both set at substantially the "L" level and the potential of the output node NJ can be kept at the ground potential Vss.

When the erasing gate potential detection circuit EV-h detects that the erasing gate potential of the memory cell transistor MC in the memory cell block BMC-h is raised, the MOS transistor 117 in the circuit EV-h is turned on, causing the potential of the common bus line CBL to be lowered. Then, the output signal SHE of the inverter 114 is set to the "H" level. In this way, if the signal SHE is set to the "H" level while the erasing signal ER is set at the "H" level, the MOS transistors 121 and 122 are respectively turned on and off. As a result, the potentials of the input and output nodes of the CMOS inverter 125 are set to the "L" and "H" level, respectively, so that the potential of the node NG will be set to the "L" level and the MOS transistor 86 can be turned on. At the same time, since the potential of the output node NH of the CMOS inverter 76 is set to the "L" level, the MOS transistor 88 is turned off. As a result, the node NJ is charged from the high voltage power source Vpp via the MOS transistors 87 and 86 to a potential level of "Vpp-$V_{TH}87$".

When the erasing operation is completed and the erasing signal ER is set to the "L" level, the potential of the input node of the CMOS inverter 125 is set to the "H" level. As a result, the potential of the output node of the CMOS inverter 125 is set to the "L" level, the potential of the output node NG of the switching circuit 106 is set to the Vpp level, and the MOS transistor 86 is turned off. At this time, since the signal SHE is still kept at the "H" level, the potential of the output node NH of the CMOS inverter 76 is set at the "L" level, thereby causing the MOS transistor 88 to be kept in the OFF state. In the same manner, the MOS transistors 113 and 105 are kept in the OFF state.

At the time of completion of the erasing mode, the potential of the erasing gates of the memory cell transistors MC in the memory cell block BMC-h is lowered. The erasing gate potential detection circuit EV-h detects that the potential of the erasing gate becomes lower than a predetermined potential level. That is, the potential of the erasing gate becomes lower than the predetermined potential level, the MOS transistor 117 of the erasing gate potential detection circuit EV-h is turned off. As a result, the common bus line CBL is charged by means of the bias circuit EBC and the potential thereof is raised. When the potential of the common bus line becomes higher than the circuit threshold voltage (for example, 2 V) of the inverter 114, the output signal SHE of the inverter 114 is set to the "L" level.

When the signal SHE is set to the "L" level, the output node NJ of the circuit VG is discharged. That is, when the signal SHE is set to the "L" level, the MOS transistors 121 and 122 are respectively turned off and on so as to keep the potentials of the input and output nodes of the CMOS inverter 125 at the "H" and "L" levels, respectively. Therefore, the potential of the node NG is kept at the Vpp level and the MOS transistor 86 is kept in the OFF state. When the signal SHE is set to the "L" level, the potential of the input node of the CMOS inverter 125 is forcedly set to the "H" level so as the level of the erasing signal ER is varied for some reason. Further, when the signal SHE is set to the "L" level, the output node NH of the CMOS inverter 76 is set to the "H" level and the MOS transistor 88 is turned on to start the operation of discharging the node NJ. When the potential of the node NJ is lowered and exceeds the threshold voltages of the MOS transistors 128 and 109, the MOS transistors 128 and 109 are respectively turned on and off. As a result, the potential of the node NK is set to the "H" level, the potential of the output node of the CMOS inverter 112 is set to the "L" level and the MOS transistor 80 is turned off. Further, the potential of the output node of the CMOS inverter 79 is set to the "H" level and the MOS transistor 113 is turned on to speed up the operation of discharging the node NJ. After the delay time determined by the delay circuit 89 has elapsed, the potential of the node NI is set to the "H" level and the MOS transistor 105 is turned on to further speed up the operation of discharging the output node NJ.

In the above example, the memory cell block BMC-h is selected and the memory data of the memory cell transistors MC in the selected block is erased. However, it is possible to select a plurality of memory cell blocks BMC by means of the block erasing decoder circuit BED and simultaneously erase the memory data of the selected blocks in the same manner as described above. Further, it is also possible to select all the memory cell blocks BMC and simultaneously erase the memory data of all the memory cell transistors MC in the memory cell array MCA.

With the construction shown in FIGS. 18 to 20, the potential of the erasing gate is detected and the source potential of the memory cell transistor MC can be raised when the erasing gate potential has reached a predetermined potential level. Further, when the erasing gate potential becomes lower than a predetermined potential level, the source potential can be lowered In this way, if the source potential is set according to the detected erasing gate potential, influence by fluctuation in the process parameter can be suppressed to a minimum. Therefore, a potential difference $V_{ES}$ between the erasing gate and source region can be always kept below a preset value. For example, assume that the potential of the erasing gate is raised toward 20 V, the output voltage of the circuit VG is 10 V, and the erasing gate potential detection circuit EV outputs a detection signal when the potential (signal HE) of the erasing gate is set at 2 V. Then, since the source is charged to 10 V when the erasing gate is set to 2 V at the initial time of the erasing operation, the potential of the erasing gate as viewed from the source of the memory cell transistor MC or the potential difference $V_{ES}$ becomes $-8$ V. At the end of the erasing operation, the potential relation is reversed That is, the source potential is kept at 10 V until the potential of the erasing gate is lowered to 2 V, and the source potential is set to 0 V when the potential of the erasing gate becomes lower than 2 V so that the potential difference $V_{ES}$ can be set to 10 V at maximum. When an oxide film disposed between the source region and the erasing gate electrode is formed with a thickness of 500 Å, the electric field applied to the oxide film is "$20/500 \times 10^{-8} = 4$ MV/cm" if the source potential generation circuit VG is not used. However, if this invention is applied (that is, the source potential generation circuit VG is used), the electric field applied to the oxide film is "$10/500 \times 10^{-8} = 2$ MV/cm" which is half the value in the former case. Therefore, the dielectric breakdown of the oxide film disposed between the source region and the erasing gate electrode can be prevented, thus enhancing the reliability of the memory device.

In the circuits shown in FIGS. 18 and 19, the erasing line potential detection circuits EV-1 to EV-k are arranged on the opposite side of the erasing circuits EC-1 to EC-k with respect to the memory cell array MCA and are constructed to detect the potential at the end of the erasing line SL. This is because the potentials of the erasing line SL at portions near and apart from the erasing circuits EC-1 to EC-k may be made different from each other by the different delay times determined by the resistance components and capacitance components thereof when the erasing gate and erasing line SL are formed of polysilicon. In this way, if the potential is detected at a remote portion from the erasing circuits, the source potential generation circuit VG will be operated only after the potential of the erasing line SL has exceeded a detection potential level. However, since the difference between the above potentials due to the delay time can be previously calculated, the detection potential level of the detection circuits EV-1 to EV-k can be corrected so as to permit the detection circuits EV-1 to EV-k to be disposed adjacent to the erasing circuits EC-1 to EC-k. Further, it is also possible to dispose the detection circuits EV-1 to EV-k adjacent to and apart from the erasing circuits EC-1 to EC-k. In the above embodiment, a single source potential generation circuit VG is used. However, k number of source potential generation circuits can be provided for respective memory cell blocks BMC-1 to BMC-k or the source potential generation circuits of a desired number less than k can be used. In a case where k number of source potential generation circuits are used, the source potential generation circuits VG are connected to the output nodes of the respective detection circuits EV-1 to EV-k so that the common bus line CBL can be omitted. It is possible to connect the source potential generation circuits of a desired number less than k to the common bus line CBL and operate them simultaneously or with a preset delay time.

Further, with the construction shown in FIG. 20, the output node NJ is gradually discharged with different stages by use of the three MOS transistors 88, 113 and 105. However, it is also possible to use one, two or more than three MOS transistors so as to discharge the output node.

Next, the method for forming the oxide film disposed between the erasing gate and source region of each of the memory cell MOS transistors MC11 to MCmn shown in FIG. 1 is explained.

First, a field oxide film is formed as an element isolation region on a semiconductor substrate by selectively oxidizing the substrate surface by the LOCOS method, for example. Then, n-type impurity is ion-implanted into that portion of the substrate which lies under the formation area of the erasing gate electrode to form a source region with a resist pattern of a predetermined pattern formed by the photolithographic method used as a mask. After this, the substrate surface is subjected to a thermal oxidation process to form a first gate oxide film. The first gate oxide film is formed so that the film thickness of a portion thereof on the exposed surface of the substrate may be set to approximately 300 Å. In this case, since the portion into which the n-type impurity is ion-implanted has a high impurity concentration, the oxide film is formed to a thickness of approximately 600 Å. Then, a first polysilicon layer is formed on the first gate oxide film and a reactive ion etching process is effected by use of a mask formed by the photolithographic process to make the first polysilicon layer in a predetermined pattern. Thus, the floating gate electrode can be formed. In the above reactive ion etching process, since the selective ratio of the oxide film to the polysilicon is 8:1, the oxide film on the n+-type diffusion layer which is the source region is etched by 150 Å and is reduced in thickness to approximately 450 Å. After this, a second gate oxide film is formed on the resultant structure. At this time, since an oxide film is hardly formed on another oxide, the film thickness of the oxide film on the n+-type diffusion layer is kept at approximately 450 Å. Next, a second polysilicon layer is formed on the second gate oxide film and a reactive ion etching process is effected by use of a mask formed by the photolithographic process to make the second polysilicon layer in a predetermined pattern. Thus, the erasing gate electrode can be formed.

As described above, since the oxide film between the erasing gate electrode and the source region is etched in the process of etching the first polysilicon layer, it becomes difficult to control the film thickness thereof. In particular, it becomes more difficult when the size of the memory cell transistor is reduced. In order to solve the problem that the film thickness of the oxide film is excessively reduced and the reliability thereof is degraded, a method is proposed to leave behind the floating gate electrode in an intersection area between the source region and the erasing gate electrode when the floating gate electrode is formed by patterning the first polysilicon layer after formation of the first gate oxide film. With the above method, the oxide film in the intersection area is prevented from being etched in a process of etching the first polysilicon layer and thus the high reliability can be maintained.

Now, the construction of the memory cell array MCA shown in FIG. 1 is explained with reference to FIGS. 21, 22A, 22B, 23, 24A and 24B.

Figure 21:
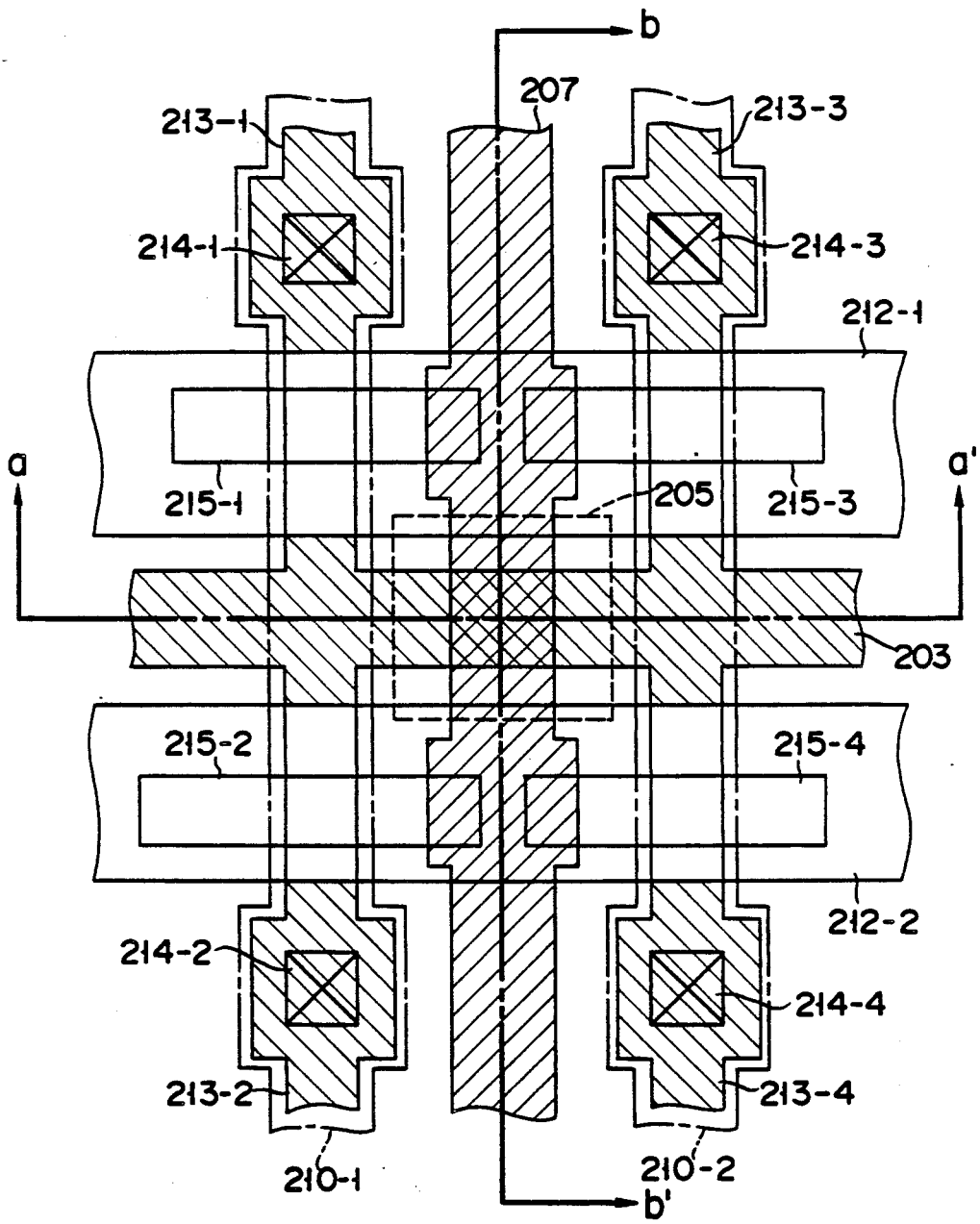
FIG. 21 is a plan view showing the construction of a pattern of a portion of the memory cell array in the circuit of FIG. 1.
Figure 22A:
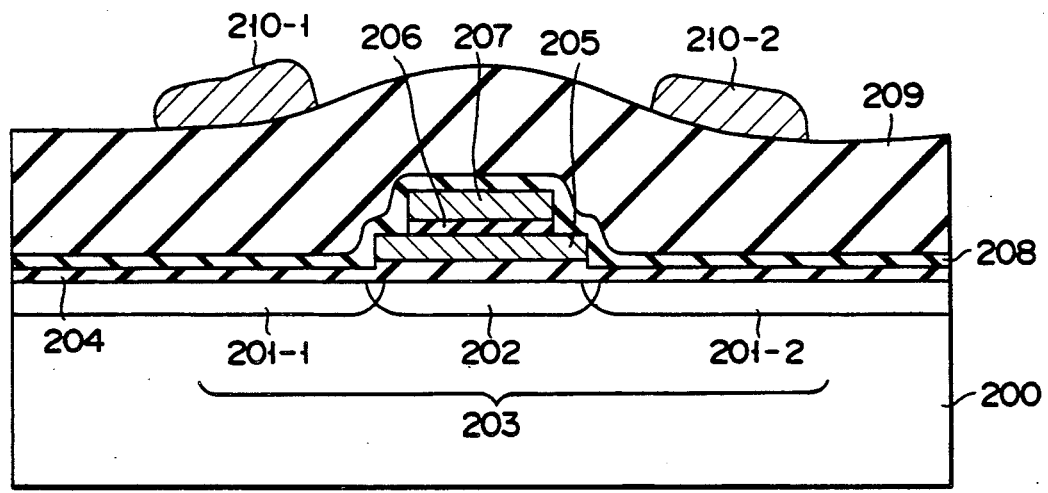
FIG. 22A is a cross sectional view of the pattern taken along the line a—a' of FIG. 21.

FIG. 21 is a plan view showing the construction of a pattern of a portion of the memory cell array MCA in the circuit of FIG. 1. FIG. 22A is a cross sectional view of the pattern taken along the line a—a' of FIG. 21 and FIG. 22B is a cross sectional view of the pattern taken along the line b—b' of FIG. 21.

As shown in FIG. 22A, $n^+$-type impurity regions 201-1 and 201-2 are separately formed with a preset distance therebetween in the main surface area of the p-type semiconductor substrate 200. An n-type impurity region is formed between the regions 201-1 and 201-2. The regions 201-1, 201-2 and 202 act as source regions and are arranged in a row direction of the memory cell array as shown in FIG. 21. A first gate oxide film 204 is formed on the substrate 200. A protection polysilicon layer 205 is formed on that portion of the first gate oxide film 204 which lies on the n-type impurity region 202. A second gate oxide film 206 is formed on the polysilicon layer 205 and an erasing gate electrode 207 is formed on the oxide film 206. The erasing gate electrode 207 is formed to extend in a column direction of the memory cell array or in a direction which intersects the source region 203. An insulation film 208 with a laminated structure of oxide film-nitride film-oxide film is formed on the resultant structure. An interlayer insulation film 209 is formed on the insulation film 208. Data lines 210-1 and 210-2 formed of, for example, aluminum are formed on the interlayer insulation film 209. The data lines 210-1 and 210-2 are arranged on both sides of the erasing gate electrode 207 along the column direction of the memory cell array.

Figure 22B:
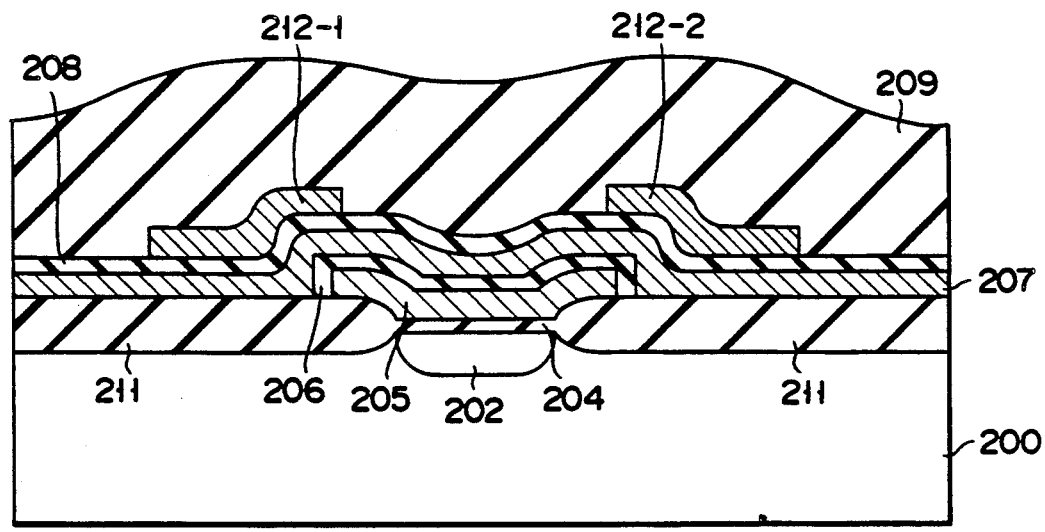
FIG. 22B is a cross sectional view of the pattern taken along the line b—b' of FIG. 21.

As shown in FIG. 22B, an element isolation field oxide film 211 is selectively formed on the main surface of the p-type semiconductor substrate 200. The n-type impurity region 202 is formed in the surface area of the substrate 200 defined by the field oxide film 211 and the first gate oxide film 204 is formed on the region 202. The protection polysilicon layer 205 is formed on part of the field oxide film 211 and the oxide film 204 and the second gate oxide film 206 is formed on the surface of the polysilicon layer 205. Then, the erasing gate electrode 207 is formed on the resultant structure. The insulation film 208 of the three-layered structure of oxide film—nitride film—oxide film is formed on the erasing gate electrode 207. The control gates 212-1 and 212-2 are formed on the insulation film 208. As shown in FIG. 21, the control gates 212-1 and 212-2 are formed on both sides of the source region 203 along the row direction of the memory cell array.

Further, as shown in FIG. 21, drain regions 213-1 to 213-4 formed of $n^+$-type impurity regions are formed in the main surface area of the substrate 200 under the data lines 210-1 and 210-2. The control gate electrode 212-1 is arranged between the source region 203 and the drain regions 213-1 and 213-3, and the control gate electrode 212-2 is arranged between the source region 203 and the drain regions 213-2 and 213-4. The data line 210-1 is connected to the drain regions 213-1 and 213-2 via contact holes 214-1 and 214-2, and the data line 210-2 is connected to the drain regions 213-3 and 213-4 via contact holes 214-3 and 214-4. Further, a floating gate electrode 215-1 is formed below the control gate electrode 212-1 which is arranged between the drain region 213-1 and the source region 203 with an insulation film (not shown) disposed therebetween and a floating gate electrode 215-2 is formed below the control gate electrode 212-2 which is arranged between the drain region 213-2 and the source region 203 with an insulation film (not shown) disposed therebetween. Likewise, a floating gate electrode 215-3 is formed below the control gate electrode 212-1 which is arranged between the drain region 213-3 and the source region 203 with an insulation film (not shown) disposed therebetween and a floating gate electrode 215-4 is formed below the control gate electrode 212-2 which is arranged between the drain region 213-4 and the source region 203 with an insulation film (not shown) disposed therebetween. Each of the floating gate electrodes 215-1 to 215-4 is formed to partly overlap erasing gate electrode 207 and tunnel insulation films (not shown) are formed in the overlapped portions.

With the above construction, since the protection polysilicon layer 205 is formed between the source region 203 and the erasing gate electrode 207, the breakdown voltage of the first gate oxide film 204 disposed between the source region 203 and the erasing gate electrode 207 can be enhanced. Further, since the polysilicon layer 205 is formed on the first gate oxide film 204 at the intersecting portion to protect the first gate oxide film 204, the first gate oxide film 204 at the intersecting portion can be prevented from being etched in the process of patterning the erasing gate electrode 207 in the manufacturing process of the memory device, thereby preventing reduction in the reliability due to decrease in the film thickness of the oxide film 204.

FIG. 23 is a plan view showing another pattern construction of part of the memory cell array MCA in the circuit of FIG. 1. FIG. 24A is a cross sectional view of the pattern taken along the line c—c' of FIG. 23, and FIG. 24B is a cross sectional view of the pattern taken along the line d—d' of FIG. 23. The construction shown in FIGS. 23, 24A and 24B is obtained by applying this invention to a memory device having the construction in which the source region of a memory cell transistor MC and the drain region of an adjacent memory cell transistor MC are commonly formed.

In the main surface area of a p-type semiconductor substrate 230, $n^+$-type source-drain common regions 231-1 to 231-3 are separately formed with a preset distance therebetween. The regions 231-1 to 231-3 are formed along the column direction of the memory cell array. Further, a first gate oxide film 232 is formed on the substrate 230. A floating gate electrode 233-1 is formed on that portion of the oxide film 232 which lies between the source-drain common regions 231-2 and 231-1 and a floating gate electrode 233-2 is formed on that portion of the oxide film 232 which lies between the source and drain common regions 231-3 and 231-2. An insulation film 234 with a three-layered structure of oxide film-nitride film-oxide film is formed on the resultant structure. A control gate electrode 235 extending in the row direction of the memory cell array is formed on the insulation film 234. Then, an interlayer insulation film 236 is formed on the resultant structure.

In the construction shown in FIG. 24B, the n+-type source-drain common region 231-2 is formed in the main surface area of the p-type semiconductor substrate 230 and an n-type impurity region 237 is formed in contact with the region 231-2. The first gate oxide film 232 is formed on the substrate 230. An erasing gate electrode 238 is formed on that portion of the oxide film 232 which lies on the n-type impurity region 237, and the three-layered insulation film 234 of oxide film-nitride film-oxide film is formed on the resultant structure. The control gate electrode 235 is formed on that portion of the insulation film 234 which lies on the erasing gate electrode 238 and part of the source-drain common region 231-2, and the interlayer insulation film 236 is formed on the resultant structure.

As shown in FIGS. 23, 24A and 24B, this invention can also be applied to a memory cell array having a construction in which the source region of a memory cell transistor is commonly formed with the drain region of an adjacent memory cell transistor.

As described above, according to this invention, an electric field applied to the oxide film formed at the intersecting portion of the erasing gate electrode and the source region can be reduced by using a source potential generation circuit so that a highly reliable nonvolatile semiconductor memory device can be provided.

What is claimed is:

1. A non-volatile semiconductor memory device comprising:
    a memory cell array including a plurality of electrically erasable and programmable memory cell transistors, each memory cell transistor having a source region, a drain region, a floating gate, an erasing gate, and a control gate;
    selecting means coupled to the memory cell transistors of said memory cell array for selecting at lest one of said memory cell transistors;
    reading/writing means for reading data from and writing data to said memory cell transistors;
    erasing potential generating circuitry coupled to the erase gates of said memory cell transistors for generating an erasing potential which is applied to the erase gates of said memory cell transistors to erase data written therein in response to a first level of an erasing control signal; and
    source potential generating circuitry having an output node coupled to the source regions of said memory cell transistors for generating a source potential which is applied to the source regions of said memory cell transistors, said source potential generating circuitry including potential generating means for generating a first source potential at said output node when data is written to read from memory cell transistors and for, in response to the first level of the erasing control signal, generating a second source potential at said output node greater than the first source potential and less than the erasing potential when data is erased from memory cell transistors.

2. The non-volatile semiconductor memory device according to claim 1, wherein said potential generating means generates a ground potential at said output node of said source potential generating circuit as a first source potential which is applied to the source regions of said memory cell transistors when data is written to and read from said memory cell array.

3. The non-volatile semiconductor memory device according to claim 1, wherein said source potential generating circuitry comprises:
    a first inverter having an input node for receiving the erasing control signal and whose terminals are coupled between a first voltage source and a reference potential source;
    a second inverter having an input node coupled an output node of said first inverter and whose terminals are coupled between a second voltage source and said reference potential source, a voltage of said first voltage source being greater than a voltage of said second voltage source; and
    a switching circuit coupled between said input node of said second inverter and said second voltage source and controlled by an output signal at an output node of said second inverter to selectively switch the source potential at said output node of said source potential generating circuitry between the first and second source potentials.

4. The non-volatile semiconductor memory device according 3, further comprising:
    potential difference reducing means connected between said output node of said first inverter and said input node of said second inverter for reducing the potential difference between said output node of said first inverter and said input node of said second converter.

5. The non-volatile semiconductor memory device according to claim 4, wherein said potential difference reducing means comprises:
    a first MOS transistor having a gate coupled to said first voltage source and a current path connected at a first end to said output node of said first inverter; and
    a second MOS transistor having a gate coupled to said second voltage source and a current path connected at a first end to a second end of the current path of said first MOS transistor and at a second end of the input node of said second inverter.

6. The non-volatile semiconductor memory device according to claim 3, wherein said second inverter comprises:
    a first MOS transistor of a first channel conductivity type having a gate coupled to said output node of said first inverter and a current path connected at a first end to said second voltage source;
    a second MOS transistor of a second channel conductivity type having a gate coupled to said output node of said first inverter and a current path connected at a first end to said reference potential source; and
    potential difference reducing means connected between a second end of the current path of said first MOS transistor and a second end of the current path of said second MOS transistor for reducing a potential difference therebetween, wherein said output node of said second inverter comprises a connection node between said first MOS transistor and said potential difference reducing means.

7. The non-volatile semiconductor memory according to claim 6 wherein said potential difference reducing means comprises:
   a third MOS transistor having a gate coupled to said second power source and a current path connected to a first end to the second end of the current path of said first MOS transistor; and
   a fourth MOS transistor having a gate coupled to said first power source and a current path connected at a first end to a second end of the current path of said third MOS transistor and at a second end to the second end of the current path of said second MOS transistor.

8. The non-volatile semiconductor memory device according to claim 7, wherein said first MOS transistor comprises a P-channel type MOS transistor and said second, third, and fourth MOS transistors comprise N-channel type MOS transistors.

9. The non-volatile semiconductor memory device according to claim 7, wherein said first MOS transistor comprises a P-channel type MOS transistor, said second MOS transistor comprises an N-channel MOS transistor, and said third and fourth MOS transistors comprise depletion type MOS transistors.

10. The non-volatile semiconductor memory device according to claim 3, wherein said switching circuit comprises:
    a MOS switching transistor having a gate coupled to said output node of said second inverter and a current path connected between said input node of said second inverter and said second voltage source.

11. The non-volatile semiconductor memory device according to claim 10, wherein said MOS switching transistor comprises a P-channel MOS transistor.

12. The non-volatile semiconductor memory device according to claim 3 further comprising:
    reducing means coupled to said output node of said second inverter for reducing a level of the output signal of said second inverter to provide the second source potential at said output node of said source potential generating circuitry in response to the first level of the erasing control signal.

13. The non-volatile semiconductor memory device according to claim 12 wherein said reducing means comprises:
    a first MOS transistor of a first channel conductivity type having a gate coupled to said output node of said second inverter and a current path connected at a first end to said second voltage source;
    a second MOS transistor of a second channel conductivity type having a gate coupled to said output node of said first inverter and a current path connected at a first end to said reference potential source; and
    potential difference reducing means connected between a second end of the current path of said first MOS transistor and a second end of the current path of said second MOS transistor for reducing a potential difference therebetween,
    wherein said output node of said source potential generating circuitry comprises a connection node between said first MOS transistor and said potential difference reducing means.

14. The non-volatile semiconductor memory device according to claim 13 wherein said potential difference reducing means comprises:
    a third MOS transistor having a gate coupled to said second voltage source and a current path connected at a first end to a second end of the current path of said first MOS transistor; and
    a fourth MOS transistor having a gate coupled to said first voltage source and a current path connected at a first end to a second end of the current path of said third MOS transistor and at a second end to a second end of the current path of said second MOS transistor.

15. The non-volatile semiconductor memory device according to claim 14 wherein said first MOS transistor comprises a P-channel type MOS transistor and said second, third, and fourth MOS transistors comprise N-channel type MOS transistors.

16. The non-volatile semiconductor memory device according to claim 14 wherein said first MOS transistor comprises a P-channel type MOS transistor, said second MOS transistor comprises an N-channel MOS transistor, and said third and fourth MOS transistors comprise depletion type MOS transistors.

17. The non-volatile semiconductor memory device according to claim 3 further comprising:
    discharging means for discharging said output node of said source potential generating circuitry to set the first source potential when the erasing control signal switches from the first level to a second level; and
    delay means having an input node connected to said output node of said first inverter and coupled to said discharging means for delaying an application of a signal at said output node of said first inverter to said discharging means so as to delay discharging of said output node of said source potential generating circuitry for a predetermined time after said erasing control signal switches from the first level to the second level.

18. The non-volatile semiconductor memory device according to claim 17 wherein said delay means comprises:
    a plurality of inverters connected in cascade and each including an output node;
    a capacitor coupled between the output node of each inverter and said reference potential source;
    first switching means responsive to the first level of the erasing control signal for inhibiting a supply of power from said first voltage source to a final stage of said plurality of inverters; and
    second switching means responsive to the first level of the erasing control signal for supplying a reference potential to an output node of said final stage of said plurality of inverters.

19. The non-volatile semiconductor memory device according to claim 17 wherein said discharging means comprises:
    a first MOS transistor having a gate connected to said second voltage source and a current path connected at a first end to said output node of said source potential generating circuit;
    a second MOS transistor having a gate connected to said first voltage source and a current path connected at a first end to a second end of the current path of said first MOS transistor; and
    a third MOS transistor having a gate coupled to an output node of said delay means and a current path connected between the second end of the current path of said second MOS transistor and at a second end to said reference potential source.

20. The non-volatile semiconductor memory device according to claim 3 further comprising:
a first MOS transistor of P-channel type having a gate coupled to said output node of said second inverter and a current path connected at a first end to said second voltage source;
a second MOS transistor of depletion type having a gate coupled to said second voltage source and a current path connected at a first end to a second end of the current path of said first MOS transistor;
a third MOS transistor of depletion type having a gate coupled to said first voltage source and a current path connected at a first end to a second end of the current path of said second MOS transistor;
a fourth MOS transistor of N-channel type having a gate coupled to said output node of said second inverter and a current path connected at a first end to a second end of the current path of said third MOS transistor and at a second end to said reference potential source;
a fifth MOS transistor of N-channel type having a gate coupled to said output node of said second inverter and a current path connected at a first end to said second voltage source;
a sixth MOS transistor of depletion type having a gate coupled to said second voltage source and a current path connected at a first end to a second end of the current path of said fifth MOS transistor;
a seventh MOS transistor of depletion type having a gate coupled to said first voltage source and a current path connected at a first end to a second end of the current path of said sixth MOS transistor; and
an eighth MOS transistor of N-channel type having a gate coupled to a connection node between said first and second MOS transistors and a current path connected at a first end to a second end of the current path of said seventh MOS transistor and at a second end to said reference potential source,
wherein said output node of said source potential generating circuit comprises a connection node between said fifth and sixth MOS transistors.

21. The non-volatile semiconductor memory device according to claim 3 wherein the first level of said source potential at said output node of said source potential generating circuitry is substantially the voltage level of said second power source and the second level of said source potential at said output node of said source potential generating circuitry is substantially ground potential.

22. The non-volatile semiconductor memory device according to claim 3, further comprising:
reducing means for reducing a level of the voltage at said output node of said second inverter to provide a source potential at said output node of said source potential generating circuitry of a level lower than the potential at the output of said second inverter.

23. The non-volatile semiconductor memory device according to claim 22 wherein said reducing means comprises at least one MOS transistor whose gate is coupled to the output of said second inverter and one of whose source and drain regions is coupled to said second voltage source such that the source potential at said output node of said source potential generating circuitry is less than the potential at the output of said second inverter by an amount equal to a threshold voltage of said least one MOS transistor.

24. This non-volatile semiconductor memory device according to claim 1 wherein said source potential generating circuitry comprises:
potential switching means coupled to receive the erasing control signal for switching the potential level of the erasing control signal between the voltage of said second voltage source and a group potential;
charging means for charging said output node of said source potential generating circuitry in accordance with a potential at an output of said potential switching means;
first discharging means for discharging said output node of said source potential generating circuitry in accordance with the erasing control signal;
delay means for delaying the erasing control signal; and
second discharging means for discharging said output node of said source potential generating circuitry in accordance with an output signal of said delay means.

25. The non-volatile semiconductor memory device according to claim 24 wherein said potential switching means comprises:
an inverter having an input node for receiving the erasing control signal;
a first MOS transistor of N-channel type having a gate coupled to receive the erasing control signal and a current path connected at a first end to a reference potential source;
a second MOS transistor of N-channel type having a gate coupled to an output node of said inverter and a current path connected at a first end to said reference potential source;
a third MOS transistor of depletion type having a gate coupled to said first voltage source and a current path connected at a first end to a second end of the current path of said first MOS transistor;
a fourth MOS transistor of depletion type having a gate coupled to said first voltage source and a current path connected at a first end to a second end of the current path of said second MOS transistor;
a fifth MOS transistor of P-channel type having a gate coupled to a second end of the current path of said fourth transistor and a current path connected between a second end of the current path of said third MOS transistor and said second voltage source; and
a sixth MOS transistor of P-channel type having a gate coupled to a second end of the current path of said third transistor and a current path connected at a first end to a second end of the current path of said fourth MOS transistor and at a second end to said second power source,
wherein an output node of said potential switching means comprises a connection node between said third and fifth MOS transistors.

26. The non-volatile semiconductor memory device according to claim 24, wherein said charging means comprises:
a first MOS transistor of N-channel type having a gate and a first end of a current path thereof coupled to said second voltage source; and
a second MOS transistor of P-channel type having a gate coupled to an output node of said potential switching means and a current path connected at a first end to a second end of the current path of said first MOS transistor and at a second end to said output node of said source potential generating means.

27. The non-volatile semiconductor memory device according to claim 24, wherein said first discharging means comprises:
   an inverter having an input node for receiving the erasing control signal; and
   an N-channel transistor having a gate connected to an output node of said inverter and a current path connected at a first end of said output node of said source potential generating circuitry and at a second end to said reference potential source.

28. The non-volatile semiconductor memory device according to claim 24, wherein said delay means comprises:
   a plurality of inverters connected in cascade and having respective output nodes; and
   capacitors connected between the output node of said inverters and said reference potential source.

29. The non-volatile semiconductor memory device according to claim 24, wherein said second discharging means comprises:
   a first MOS transistor of N-channel type having a gate coupled to receive the erasing control signal and a current path connected at a first end to said reference potential source; and
   a second MOS transistor of N-channel type having a gate coupled to an output node of said delay means and a current path connected at a first end to a second end of the current path of said first MOS transistor and at a second end to said reference potential source.

30. The non-volatile semiconductor memory device according to claim 24 further comprising:
   potential detecting means for detecting a potential of said output node of said source potential generating circuitry, wherein said delay means is controlled by an output signal of said potential detecting means.

31. The non-volatile semiconductor memory device according to claim 30, wherein said potential detecting means comprises:
   a first MOS transistor of P-channel type having a gate coupled to said output node of said source potential generating circuitry and a current path connected at a fist end to said first voltage source;
   a second MOS transistor of P-channel type having a gate coupled to receive the erasing control signal and a current path connected at a first end to a second end of the current path of said first MOS transistor;
   a third MOS transistor of N-channel type having a gate coupled to receive the erasing control signal and a current path connected at a first end to a second end of the current path of said second MOS transistor and at a second end to said reference potential source;
   an inverter having an input node connected to a connection node between said second and third MOS transistors and an output node connected to an input node of said delay means; and
   a fourth MOS transistor of N-channel type having a gate coupled to said output node of said source potential generating circuitry and a current path connected at a first end to said input node of said inverter and at a second end to said reference potential source.

32. The non-volatile semiconductor memory device according to claim 24, further comprising:
   third discharging means for discharging said output node of said source potential generating circuitry after said first discharging means starts to discharge said output node of said source potential generating circuitry and until said second discharging means starts to discharge said output node of said source potential generating circuitry.

33. The non-volatile semiconductor memory device according to claim 32, wherein said third discharging means comprises:
   an N-channel MOS transistor having a gate coupled to an intermediate stage of said delay means and a current path connected at a first end to said output node of said source potential generating circuitry and at a second end to said reference potential source.

34. The non-volatile semiconductor memory device according to claim 1, further comprising:
   erasing output detecting means for detecting an output of said erasing potential generating circuitry, wherein said source potential generating circuitry is responsive to said erasing output detecting means.

35. The non-volatile semiconductor memory device according to claim 34, wherein said erasing output detecting means comprises:
   a first MOS transistor of N-channel type having a gate coupled to said second voltage source and a current path connected at a first end to receive the erasing potential;
   a second MOS transistor of N-channel type having a gate coupled to a second end of the current path of said first MOS transistor and a current path connected at a first end to a reference potential source;
   a third MOS transistor of P-channel type having a gate coupled to said reference potential source and a current path connected at a first end to a second end of the current path of said second MOS transistor and at a second end to said first voltage source; and
   an inverter having an input node connected to a connection node between said second and third MOS transistors and an output node connected to a control input terminal of said source potential generating circuitry and whose terminals are coupled to said first voltage source and said reference potential source.

36. The non-volatile semiconductor memory device according to claim 34, wherein said erasing output detecting means comprises:
   a first MOS transistor of N-channel type having a gate coupled to said second voltage source and a current path connected at a first end to receive the erasing potential;
   a second MOS transistor of N-channel type having a gate coupled to a second end of the current path of said first transistor and a current path connected at a first end to a reference potential source;
   a third MOS transistor of N-channel type having a gate connected to said second voltage source and a current path connected at a first end to a second end of of the current path of said second MOS transistor;

a fourth MOS transistor of P-channel type having a gate connected to said reference potential source and a current path connected at a first end to a second end of the current path of said third MOS transistor and at a second end to said second voltage source; and an inverter having an input node connected to a connection node between said third and fourth MOS transistors and an output node connected to a control input terminal of said source potential generating means and whose terminals are coupled to said first voltage source and said reference potential source.

37. A non-volatile semiconductor memory device according to claim 34, wherein said erasing output detecting means comprises:

a first MOS transistor of N-channel type having a gate coupled to said second power source and a current path connected at a first end to receive the erasing potential;

a second MOS transistor of N-channel type having a gate connected to the second end of the current path of said first MOS transistor and a current path connected at a first end to a reference potential source;

a third MOS transistor of N-channel type having a gate connected to receive the erasing control signal and a current path connected at a first end to a second end of the current path of said second MOS transistor;

a fourth MOS transistor of P-channel type having a gate connected to said reference potential source and a current path connected at a first end to a second end of the current path of said third MOS transistor and at a second end to said first voltage source; and an inverter having an input node connected to a connection node between said third and fourth MOS transistors and an output node connected to a control input terminal of said source potential generating circuitry and whose terminals are coupled between said first voltage source and said reference potential source.

38. A non-volatile semiconductor memory device according to claim 1, further comprising:

erasing gate potential detecting means for detecting a potential of the erasing gate of each of said memory cell transistors, wherein said source potential generating circuitry is responsive to said erasing gate potential detecting means.

39. A non-volatile semiconductor memory device according to claim 38, wherein said source potential generating circuitry comprises:

potential switching means connected to receive the erasing control signal and an output signal of said erasing gate potential detecting means for switching a level of the erasing control signal between the voltage level of said second voltage source and a ground potential when said erasing gate potential detecting means detects that the potential of the erasing gates has exceeded a predetermined potential level;

charging means for charging said output node of said source potential generating circuitry in accordance with an output of said potential switching means; and first discharging means for discharging said output node of said source potential generating circuitry in accordance with said erasing control signal.

40. A non-volatile semiconductor memory device according to claim 39, wherein said source potential generating circuitry further comprises:

delay means for delaying the erasing control signal; and second discharging means for discharging said output node of said source potential generating circuitry in accordance with an output signal of said delay means.

41. A non-volatile semiconductor memory device according to claim 40, wherein said source potential generating circuitry further comprises:

third discharging means controlled by an intermediate state of said delay means for discharging said output stage node.

42. A non-volatile semiconductor memory device comprising:

a memory cell array comprising a plurality of memory cell blocks each including electrically erasable and programmable memory cell transistors, each memory cell transistor having a source region, a drain region, a floating gate, an erasing gate, and a control gate;

selecting means coupled to said memory cell transistors for selecting at least one of said memory cell transistors;

reading/writing means for reading data from and writing data to said memory cell transistors;

erasing potential generating circuits respectively coupled to said memory cell blocks;

a block erasing decoder circuit for generating erasing control signals for controlling and erasing potential generating circuits, each of said erasing potential generating circuits generating an erasing potential which is applied to the erase gate of the memory cell transistors of the associated memory cell blocks to erase data written therein in response to a first level of a respective erasing control signal; and source potential generating circuits having output nodes and respectively coupled to said memory cell blocks for generating a source potential which is applied to the source regions of the memory cell transistors of the associated memory cell block, each of said source potential generating circuits including potential generating means for generating a first source potential at said output node when data is written to and read from the associated memory cell block and for, in response to the first level of the control signal, generating a second source potential at said output node greater than the first source potential and less than the erasing potential when data is erase from the associated memory cell blocks.

* * * * *